(12) United States Patent
Yoshioka et al.

(10) Patent No.: US 7,656,176 B2
(45) Date of Patent: Feb. 2, 2010

(54) PROBE MEMBER FOR WAFER INSPECTION, PROBE CARD FOR WAFER INSPECTION AND WAFER INSPECTION EQUIPMENT

(75) Inventors: Mutsuhiko Yoshioka, Chuo-ku (JP); Hitoshi Fujiyama, Chuo-ku (JP); Hisao Igarashi, Chuo-ku (JP)

(73) Assignee: JSR Corporation, Tokyo (JP)

( * ) Notice: Subject to any disclaimer, the term of this patent is extended or adjusted under 35 U.S.C. 154(b) by 362 days.

(21) Appl. No.: 11/718,065

(22) PCT Filed: Oct. 27, 2005

(86) PCT No.: PCT/JP2005/019799

§ 371 (c)(1), (2), (4) Date: Apr. 26, 2007

(87) PCT Pub. No.: WO2006/046650

PCT Pub. Date: May 4, 2006

(65) Prior Publication Data

US 2009/0140756 A1 Jun. 4, 2009

(30) Foreign Application Priority Data

Oct. 29, 2004 (JP) .............................. 2004-315522

(51) Int. Cl.
*G01R 31/02* (2006.01)

(52) U.S. Cl. ..................................................... 324/754

(58) Field of Classification Search ................. 324/765, 324/754, 761–762, 158.1; 438/14–18; 257/48; 361/212, 220; 439/69–71, 86, 91
See application file for complete search history.

(56) References Cited

U.S. PATENT DOCUMENTS

| | | | |
|---|---|---|---|
| 5,828,226 A * | 10/1998 | Higgins et al. ............... 324/762 |
| 6,215,321 B1 * | 4/2001 | Nakata ........................ 324/754 |
| 6,969,622 B1 | 11/2005 | Kokubo et al. |
| 7,049,836 B2 | 5/2006 | Setaka |
| 7,095,241 B2 | 8/2006 | Setaka et al. |
| 7,131,851 B2 | 11/2006 | Setaka et al. |
| 2007/0069743 A1 | 3/2007 | Inoue et al. |

OTHER PUBLICATIONS

U.S. Appl. No. 11/718,576, filed May 3, 2007, Yoshioka, et al.

* cited by examiner

*Primary Examiner*—Ha Tran T Nguyen
*Assistant Examiner*—Tung X Nguyen
(74) *Attorney, Agent, or Firm*—Oblon, Spivak, McClelland, Maier & Neustadt, L.L.P.

(57) ABSTRACT

A probe member for wafer inspection having a sheet-like probe, the probe including a frame plate in which openings are formed, and contact films arranged on a front surface of the frame plate so as to close the openings, each of the contact films obtained by arranging, in an insulating film formed of a flexible resin, a plurality of electrode structures, and an anisotropically conductive connector, which is composed of a frame plate, in which a plurality of openings have been formed corresponding to the electrode regions, and a plurality of elastic anisotropically conductive films arranged on and supported by the frame plate so as to close the respective openings, wherein each of the openings of the frame plate in the sheet-like probe have a size for receiving the external shape in a plane direction in the elastic anisotropically conductive film of the anisotropically conductive connector.

7 Claims, 16 Drawing Sheets

Fig. 6
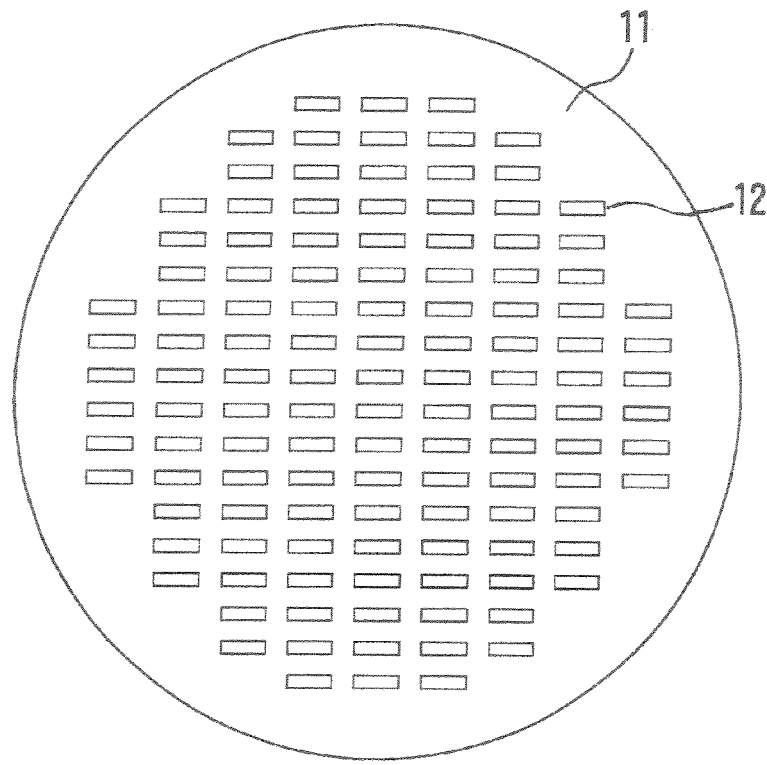
Fig. 7
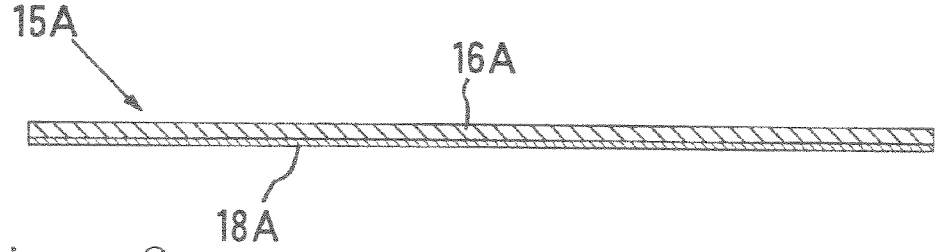
Fig. 8
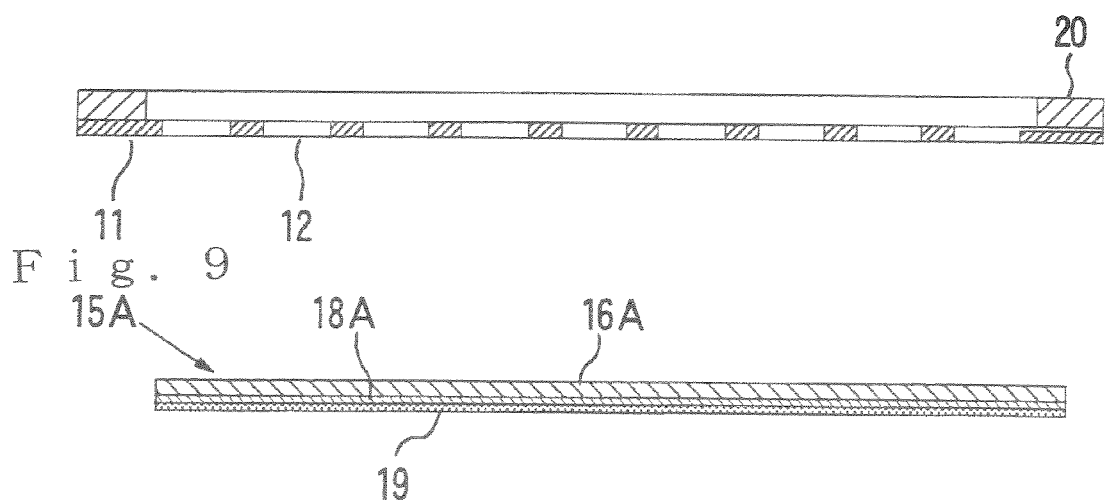
Fig. 9

PROBE MEMBER FOR WAFER INSPECTION, PROBE CARD FOR WAFER INSPECTION AND WAFER INSPECTION EQUIPMENT

TECHNICAL FIELD

The present invention relates to a probe member for wafer inspection, a probe card for wafer inspection and a wafer inspection apparatus, which are used for conducting electrical inspection of a plurality of integrated circuits formed on a wafer in a state of the wafer.

BACKGROUND ART

In the production process of semiconductor integrated circuit devices, after a great number of integrated circuits are formed on a wafer composed of, for example, silicon, a probe test that basic electrical properties of each of these integrated circuits are inspected, thereby sorting defective integrated circuits is generally conducted. This wafer is then diced, thereby forming semiconductor chips. Such semiconductor chips are housed and sealed in respective proper packages. Each of the packaged semiconductor integrated circuit devices is further subjected to a burn-in test that electrical properties thereof are inspected under a high-temperature environment, thereby sorting semiconductor integrated circuit devices having latent defects.

In such electrical inspection of integrated circuits, such as probe test or burn-in test, a probe card having inspection electrodes arranged in accordance with a pattern corresponding to a pattern of electrodes to be inspected is in use for electrically connecting each of the electrodes to be inspected in an object of inspection to a tester. As such a probe card, has heretofore been used that, on which inspection electrodes (inspection probes) each composed of a pin or blade are arranged.

By the way, in the probe test conducted for integrated circuits formed on a wafer, a method that a wafer is divided into a plurality of areas, in each of which, for example, 16 integrated circuits have been formed, a probe test is performed collectively on all the integrated circuits formed in an area, and the probe test is successively performed collectively on the integrated circuits formed in other areas has heretofore been adopted. In recent years, there has been a demand for collectively performing a probe test on a greater number of integrated circuits for the purpose of improving inspection efficiency and reducing inspection cost.

In the burn-in test on the other hand, it takes a long time to individually conduct electrical inspection of a great number of integrated circuit devices because each integrated circuit device that is an object of inspection is fine, and its handling is inconvenient, whereby inspection cost becomes considerably high. From such reasons, in recent years, there has been proposed a WLBI (Wafer Level Burn-in) test in which the burn-in test is performed collectively on a great number of integrated circuits formed on a wafer.

In order to produce a probe card used in such a probe test or WLBI test, it is however necessary to arrange a very great number of inspection probes, so that such a probe card is extremely expensive. In addition, when the number of electrodes to be inspected is great, and the pitch thereof is fine, it is difficult to produce the probe card itself.

From such reasons, there has been recently proposed a probe card having a circuit board for inspection, on one surface of which a plurality of inspection electrodes have been formed in accordance with a pattern corresponding to a pattern of electrodes to be inspected, an anisotropically conductive elastomer sheet arranged on one surface of this circuit board for inspection, in which a plurality of conductive parts each extending in a thickness-wise direction of the sheet have been formed in accordance with a pattern corresponding to the pattern of the electrodes to be inspected, and a sheet-like probe arranged on this anisotropically conductive elastomer sheet (for example, Patent Art. 1.). The sheet-like probe in this probe card is constructed by an insulating sheet, a plurality of electrode structures arranged in this insulating sheet in accordance with a pattern corresponding to the pattern of the electrodes to be inspected and each extending through in a thickness-wise direction of the insulating sheet, and a ring-like holding member provided at a peripheral edge portion of the insulating sheet and composed of, for example, a ceramic.

When a wafer that is an object of inspection is of a large size as at least 8 inches in diameter, and the number of electrodes to be inspected thereof is at least 5,000, particularly at least 10,000, however, a pitch between the electrodes to be inspected in each integrated circuit is extremely small, so that the anisotropically conductive elastomer sheet in the above probe card involves the following problems.

(1) It is necessary to use an anisotropically conductive elastomer sheet having a considerably large area in order to inspect a wafer having a diameter of, for example, 8 inches (about 20 cm) collectively or by dividing it into areas, in each of which a plurality of integrated circuits have been formed. However, it is extremely difficult to surely produce such an anisotropically conductive elastomer sheet because each conductive part is fine, and a proportion of the surface area of the conductive parts to the surface of the anisotropically conductive elastomer sheet is low though the area of the anisotropically conductive elastomer sheet is considerably large. Accordingly, the yield in the production of the anisotropically conductive elastomer sheet is lowered. As a result, the production cost of the anisotropically conductive elastomer sheet is increased, and in turn the inspection cost is increased.

(2) The coefficient of linear thermal expansion of a material making up the wafer, for example, silicon is about $3.3 \times 10^{-6}$/K. On the other hand, the coefficient of linear thermal expansion of a material making up the anisotropically conductive elastomer sheet, for example, silicone rubber is about $2.2 \times 10^{-4}$/K. When the material (for example, silicon) making up the integrated circuit devices that are the object of inspection and the material (for example, silicone rubber) making up the anisotropically conductive elastomer sheet are greatly different from each other in the coefficient of linear thermal expansion as described above, positional deviation occurs between the conductive parts of the anisotropically conductive elastomer sheet and the electrodes to be inspected of the integrated circuit devices when they are subjected to thermal hysteresis by temperature change. As a result, an electrically connected state is changed, and it is thus difficult to retain a stably connected state.

In order to solve the above-described problems, there has been proposed a anisotropically conductive connector composed of a frame plate, in which a plurality of openings have been formed corresponding to electrode regions, in which electrodes to be inspected of integrated circuits in a wafer that is an object of inspection have been formed, and a plurality of elastic anisotropically conductive films arranged in the respective openings in this frame plate so as no close the openings (see, for example, Patent Art. 2).

On the other hand, the sheet-like probe in the above-described probe card involves the following problems.

In the sheet-like probe of the probe card, the insulating sheet is fixed to a holding member in a state that tension has been applied thereto in order to prevent or inhibit the thermal expansion of the insulating sheet.

However, at is extremely difficult to evenly apply the tension to the insulating sheet in all directions of the plane direction thereof, and a balance of the tension applied to the insulating sheet is changed by forming the electrode structures. As a result, the insulating sheet comes to have anisotropy on thermal expansion, so that even when the thermal expansion in one direction of the plane direction can be inhibited, thermal expansion in other directions intersecting said one direction cannot be inhibited. Accordingly, the positional deviation between the electrode structures and the electrodes to be inspected cannot be surely prevented when they are subjected to thermal hysteresis by temperature change.

In addition, in order to fix the insulating sheet to the holding member in the state that the tension has been applied thereto, a complicated step of bonding the insulating sheet to the holding member under heating is required, so that a problem that increase in production cost is incurred arises.

In order to solve the above problems, the present applicant proposed a sheet-like probe composed of a frame plate, in which a plurality of openings have been formed corresponding to electrode regions, in which electrodes to be inspected of integrated circuits in a wafer, which is an object of inspection, have been formed, and a plurality of contact films arranged on and supported by one surface of the frame plate so as to close the respective openings of the frame plate, each of said contact films being composed of an insulating film and electrode structures arranged in the insulating film, and a probe card equipped with this sheet-like probe and the above-described anisotropically conductive connector (see Japanese Patent Application No. 2004-305956).

However, it has been found that such a probe card involves the following problems.

In order to achieve good electrical connection in a connecting operation between a wafer, which is an object of inspection, and the probe card, it is essential to pressurize the conductive parts of the anisotropically conductive connector in the probe card in a thickness-wise direction of the connector by back-surface electrode parts of the sheet-like probe so as to sufficiently compress the conductive parts.

As illustrated in FIG. 52, however, the frame plate 81 in the sheet-like probe 80 is present between the contact film 85 in the sheet-like probe 80 and the elastic anisotropically conductive film 95 in the anisotropically conductive connector 90, whereby the frame plate 81 of the sheet-like probe 80 comes into contact with the elastic anisotropically conductive film 95 of the anisotropically conductive connector 90 when the electrode structures 86 of the sheet-like probe 80 are pressurized, so that the conductive parts 96 of the elastic anisotropically conductive film 95 cannot be surely compressed in the thickness-wise direction of the film by the back-surface electrode parts 87 of the electrode structures 86. As a result, it is difficult to surely achieve a good electrically connected state.

Patent Art. 1: Japanese Patent Application Laid-Open No. 2001-15565;
Patent Art. 2: Japanese Patent Application Laid-Open No. 2002-184821

DISCLOSURE OF THE INVENTION

The present invention has been made on the basis of the foregoing circumstances and has as its object the provision of a probe member for wafer inspection, a probe card for wafer inspection and a wafer inspection apparatus, by which a good electrically connected state to a wafer, which is an object of inspection, can be surely achieved, positional deviation to electrodes to be inspected by temperature change can be surely prevented, and the good electrically connected state to the wafer can be stably retained even when the wafer has a large area of 8 inches or greater in diameter, and the pitch of the electrodes to be inspected is extremely small.

A probe member for wafer inspection according to the present invention comprises a sheet-like probe, which is composed of a frame plate made of a metal, in which a plurality of openings have been formed corresponding to electrode regions, in which electrodes to be inspected in all or part of integrated circuits formed on a wafer, which is an object of inspection, have been formed, and a plurality of contact films arranged on and supported by a front surface of the frame plate so as to close the respective openings, wherein each of the contact films is obtained by arranging, in an insulating film formed of a flexible resin, a plurality of electrode structures each formed by linking a front-surface electrode part exposed to a front surface of the insulating film to a back-surface electrode part exposed to a back surface thereof through a short circuit part extending in a thickness-wise direction of the insulating film in accordance with a pattern corresponding to the electrodes to be inspected, and an anisotropically conductive connector, which is composed of a frame plate, in which a plurality of openings have been formed corresponding to the electrode regions, and a plurality of elastic anisotropically conductive films arranged on and supported by the frame plate so as to close the respective openings, and is arranged on a back surface of the sheet-like probe, wherein each of the openings of the frame plate in the sheet-like probe has a size capable of receiving the external shape in a plane direction in the elastic anisotropically conductive film of the anisotropically conductive connector.

In the probe member for wafer inspection according to the present invention, the elastic anisotropically conductive films may preferably each have conductive parts for connection arranged in accordance with a pattern corresponding to the electrodes to be inspected and formed by causing conductive particles exhibiting magnetism to be contained in an elastic polymeric substance, and an insulating part mutually insulating these conductive parts for connection and composed of the elastic polymeric substance.

In such a probe member for wafer inspection, a ratio h/d of a gap h between the level of the front surface of the frame plate in the anisotropically conductive connector and the level of the front surface-side end surface of the conductive part for connection in the elastic anisotropically conductive film to a gap d between the level of the back surface of the frame plate in the sheet-like probe and the level of the electrode surface of the back-surface electrode part may preferably be at least 1.2.

In the probe member for wafer inspection according to the present invention, the thickness of the frame plate in the sheet-like probe may preferably be 10 to 200 μm.

The frame plate in the sheet-like probe and the frame plate in the anisotropically conductive connector may preferably be each formed by a material having a coefficient of linear thermal expansion of at most $3 \times 10^{-5}$/K.

A probe card for wafer inspection according to the present invention comprises a circuit board for inspection, on the front surface of which inspection electrodes have been formed in accordance with a pattern corresponding to electrodes to be inspected in all or part of integrated circuits formed on a wafer, which is an object of inspection, and the above-described probe member for wafer inspection arranged on the front surface of the circuit board for inspection.

A wafer inspection apparatus according to the present invention is a wafer inspection apparatus for conducting electrical inspection of each of a plurality of integrated circuits formed on a wafer in a state of the wafer, which comprises the above-described probe card for wafer inspection.

According to the probe member for wafer inspection according to the present invention, each of the openings of the frame plate in the sheet-like probe has a size capable of receiving the external shape in a plane direction in the elastic anisotropically conductive film of the anisotropically conductive connector, whereby it is avoided for the frame plate of the sheet-like probe to come into contact with the elastic anisotropically conductive film of the anisotropically conductive connector when the electrode structures of the sheet-like probe are pressurized, so that the elastic anisotropically conductive film can be surely compressed in the thickness-wise direction of the film. As a result, a good electrically connected state to the wafer can be surely achieved.

According to the probe member for wafer inspection according to the present invention, the sheet-like probe is formed by arranging and supporting the contact film having the electrode structures in each of the plural openings formed in the frame plate, whereby each of the contact films may be small in area. In addition, since the contact film small in area is little in the absolute quantity of thermal expansion in a plane direction of the insulating film, positional deviation by temperature change can be surely prevented even when the wafer has a large area of 8 inches or greater in diameter, and the pitch of the electrodes to be inspected is extremely small. Furthermore, the anisotropically conductive connector is formed by arranging and supporting the elastic anisotropically conductive film in each of the plural openings formed in the frame plate, whereby each of the elastic anisotropically conductive films may be small in area. In addition, since the elastic anisotropically conductive film small in area is little in the absolute quantity of thermal expansion in a plane direction thereof, positional deviation by temperature change can be surely prevented even when the wafer has a large area of 8 inches or greater in diameter, and the pitch of the electrodes to be inspected is extremely small. Accordingly, in the inspection of the wafer, the good electrically connected state to the wafer can be stably retained.

The ratio h/d is controlled to at least 1.2, whereby the conductive parts for connection of the elastic anisotropically conductive films can be sufficiently compressed in the thickness-wise direction of each film, so that the good electrically connected state to the wafer can be achieved with more certainty.

Since the probe card for wafer inspection according to the present invention is equipped with the above-described probe member for wafer inspection, a good electrically connected state can be surely achieved, and moreover positional deviation to the electrodes to be inspected by temperature change can be surely prevented even when the wafer has a large area of 8 inches or greater in diameter, and the pitch of the electrodes to be inspected is extremely small, whereby the good electrically connected state to the wafer can be stably retained.

Such a probe card for wafer inspection is extremely suitable for use as a probe card used in a wafer inspection apparatus for conducting electrical inspection of wafers having a large area of 8 inches or greater in diameter.

BRIEF DESCRIPTION OF THE DRAWINGS

FIG. 6 is a plan view illustrating a frame plate of the sheet-like probe in the first exemplary probe member.

FIG. 7 is a cross-sectional view illustrating the construction of a laminate material used for producing the sheet-like probe.

FIG. 8 is a cross-sectional view illustrating a state that a protecting tape has been arranged on a peripheral edge portion of the frame plate.

FIG. 9 is a cross-sectional view illustrating a state that an adhesive layer has been formed on a metal foil for back-surface electrode parts in the laminate material shown in FIG. 7.

DESCRIPTION OF CHARACTERS

Figure 1:
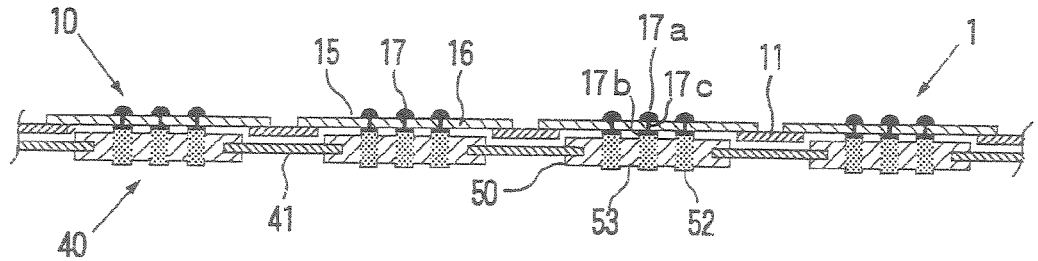
FIG. 1 is a cross-sectional view illustrating a first exemplary probe member according to the present invention.

1 Probe member
2 Controller
3 Input-output terminals
3R Input-output terminal part
4 Connector
5 Wafer mounting table
6 Wafer
7 Electrodes to be inspected
10 Sheet-like probe
11 Frame plate
12 Openings
14 Holding member
15 Contact films
15A Laminate material
16 Insulating films
16A Resin sheet for insulating films
17 Electrode structures
17H Through-holes
17a Front-surface electrode parts
17b Back-surface electrode pares
17c Short circuit parts
17d Holding parts
18 Metal film
18A Metal foil for back-surface electrode parts
18B Metal foil for forming back-surface electrode parts
18K Openings
19 Adhesive layer
20 Protecting tape
21 Insulating protecting layers
21A Resin sheet for insulating protecting layers
21B Laminate manorial
21H Through-holes
22 Metal foil for plating electrode
23 Metal film for forming holding parts
23K Openings
30 Probe card
31 Circuit board for inspection
32 First base element
33 Lead electrodes
33R Lead electrode part
34 Holder
34K Opening
34S Step portion 35 Second base element
36 Inspection electrodes
36R Inspection electrode part
37 Reinforcing member
40 Anisotropically conductive connector
41 Frame plate
42 Openings
50 Elastic anisotropically conductive films
51 Functional parts
52 Conductive parts for connection
53 Insulating parts
54 Projected portions
55 Parts to be supported
80 Sheet-like probe
81 Frame plate
85 Contact films
86 Electrode structures
87 Back-surface electrode parts
90 Anisotropically conductive connector
95 Elastic anisotropically conductive films
96 Conductive parts
P Conductive particles

BEST MODE FOR CARRYING OUT THE INVENTION

The embodiments of the present invention will hereinafter be described in details.

(Probe Member for Wafer Inspection)

Figure 2:
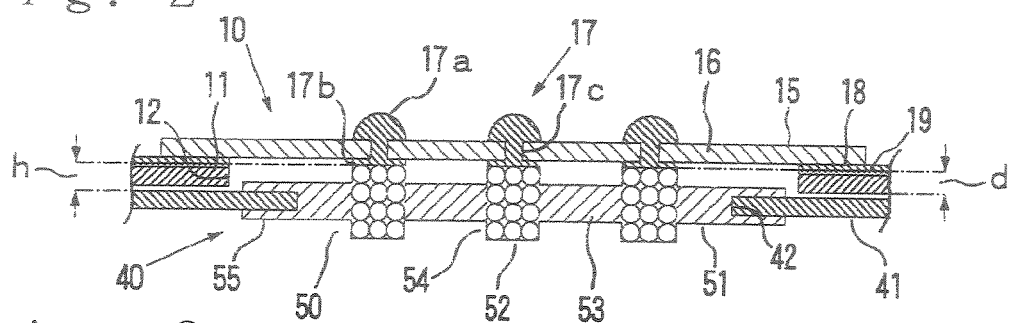
FIG. 2 is a cross-sectional view illustrating, on an enlarged scale, a principal part of the first exemplary probe member.

FIG. 1 illustrates the construction of a probe member for wafer inspection (hereinafter referred to as "probe member" merely) according to a first embodiment of the present invention, and FIG. 2 is a cross-sectional view illustrating, on an enlarged scale, a principal part of the probe member shown in FIG. 1.

The probe member 1 according to the first embodiment is used for collectively conducting a burn-in test of, for example, a wafer, on which a plurality of integrated circuits have been formed, as to each of the integrated circuits in a state of the wafer, and is constructed by a sheet-like probe 10 and an anisotropically conductive connector 40 arranged on a back surface of the sheet-like probe 10.

Figure 3:
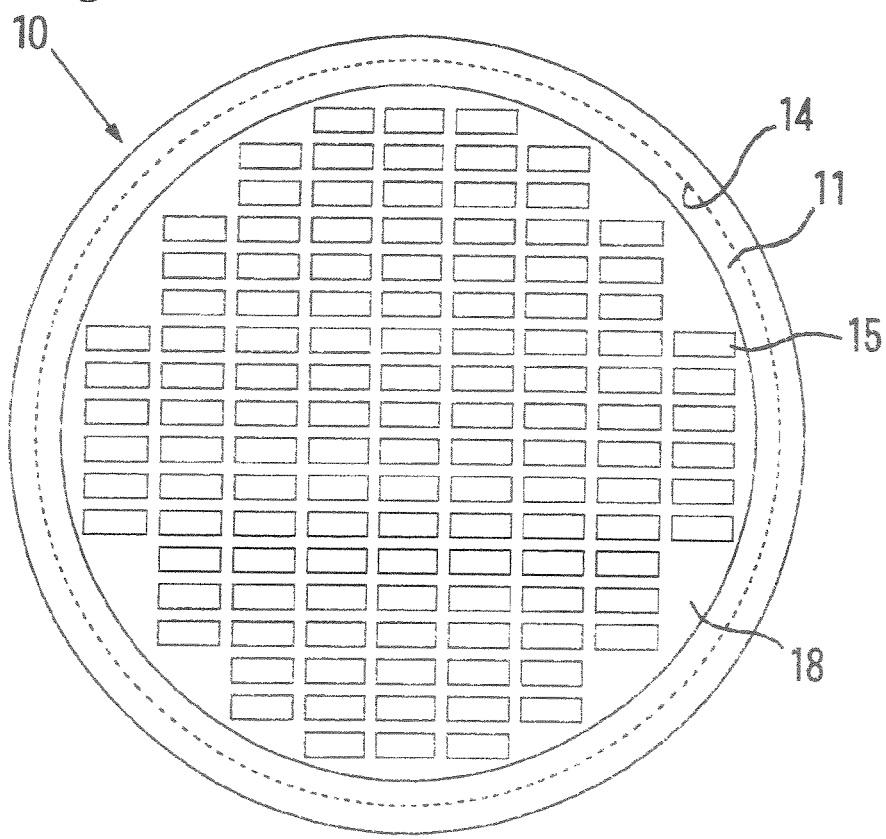
FIG. 3 is a plan view of a sheet-like probe in the first exemplary probe member.
Figure 4:
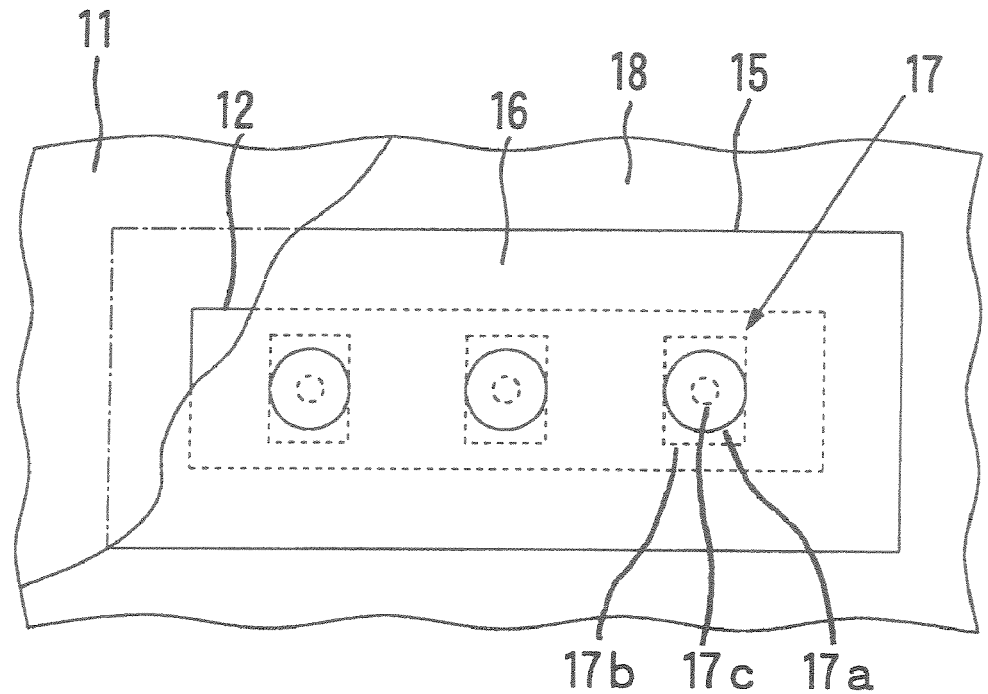
FIG. 4 is a plan view illustrating, on an enlarged scale, a contact film of the sheet-like probe in the first exemplary probe member.
Figure 5:
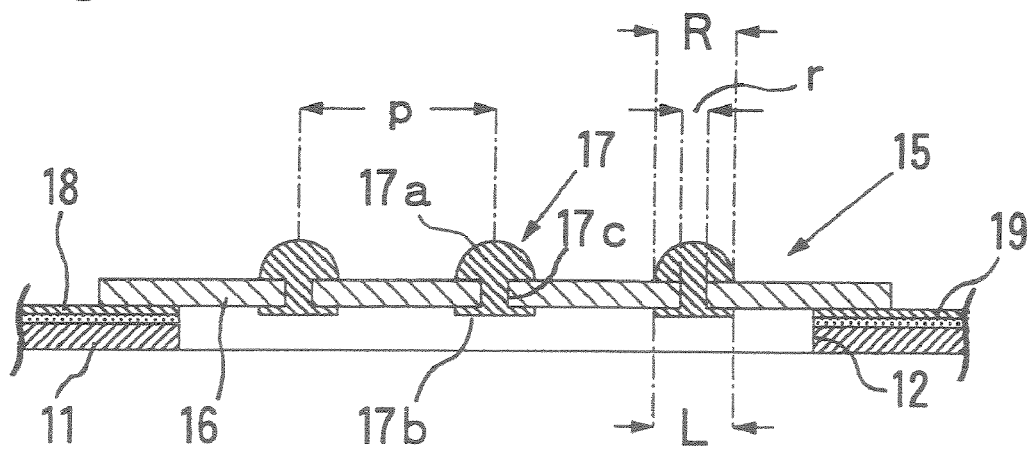
FIG. 5 is a cross-sectional view illustrating, on an enlarged scale, the construction of the contact film of the sheet-like probe in the first exemplary probe member.

FIG. 3 is a plan view illustrating the sheet-like probe 10 in the probe member 1 according to the first embodiment, and FIG. 4 and FIG. 5 are a plan view and a cross-sectional view illustrating, on a enlarged scale, a contact film in the sheet-like probe 10, respectively.

The sheet-like probe 10 has a metal-made circular frame plate 11, in which a plurality of openings have been formed, as also illustrated in FIG. 6. The openings 12 in this frame plate 11 are formed corresponding to a pattern of electrode regions, in which electrodes to be inspected in all integrated circuit formed on a wafer, which is an object of inspection, have been formed.

As a metal for forming the frame plate 11, may be used iron, copper, nickel, titanium, or an alloy or alloy steel thereof. However, an iron-nickel alloy steel such as 42 alloy, invar or covar is preferred in that the openings 12 can be easily formed by an etching treatment in a production process, which will be described subsequently.

As the frame plate 11, is preferably used a material having a coefficient of linear thermal expansion of at most $3 \times 10^{-5}$/K, more preferably $-1 \times 10^{-7}$ to $1 \times 10^{-5}$/K, particularly preferably $-1 \times 10^{-6}$ to $8 \times 10^{-6}$/K.

Specific examples of such a material for forming the frame plate 11 include invar alloys such as invar, Elinvar alloys such as Elinvar, and alloys or alloy steels such as superinvar, covar and 42 alloy.

The thickness of the frame plate 11 is preferably 10 to 200 μm, more preferably 10 to 150 μm.

If this thickness is too small, the strength required of the frame plate for supporting the resulting contact films 15 may not be achieved in some cases. If this thickness is too great on the other hand, it may be difficult in some cases no form the openings 12 with high dimensional precision by an etching treatment in she production process, which will be described subsequently.

A metal film 18 is integrally formed on one surface of the frame plate 11 through an adhesive layer 19, and a plurality of the contact films 15 are arranged and supposed on this metal film 18 so as to close the respective openings of the frame plane 11, whereby each of the contact films 15 is supported by the frame plate 11 through the adhesive layer 19 and metal film 18. On the other surface of the frame plate 11, a circular ring-like holding member 14 is arranged along a peripheral edge portion of the frame plate 11, and the frame plate 11 is held by the holding member 14.

The metal film 18 is formed by the same material as that of back-surface electrode parts 17b in electrode structures 17, which will be described subsequently.

As a material forming the adhesive layer 19, may be used a silicone rubber adhesive, epoxy adhesive, polyimide adhesive, cyanoacrylate adhesive, polyurethane adhesive or the like.

As a material forming the holding member 14, may be used an invar alloy such as invar or superinvar, an Elinvar alloy such as Elinvar, a low-thermal expansion metal material such as covar or 42 alloy, or a ceramic material such as alumina, silicon carbide or silicon nitride.

Each of the contact films 15 has a flexible insulating film 16, and in this insulating film 16, a plurality of electrode structures 17 each extending in a thickness-wise direction of the insulating film 16 and composed of a metal are arranged in relation separated from each other in a plane direction of the insulating film 16 in accordance with a pattern corresponding to a pattern of electrodes to be inspected in an electrode region of an integrated circuit formed on a wafer that is an object of inspection. The contact film 15 is arranged in such a manner that the respective electrode structures 17 are located in the opening 12 of the frame plate 11.

Each of the electrode structures 17 is formed by integrally linking a projected front-surface electrode part 17a exposed to a front surface of the insulating film 16 and a plate-like back-surface electrode part 17b exposed to a back surface of the insulating film 16 to each other through a short circuit part 17c extending through in the thickness-wise direction of the insulating film 16.

No particular limitation is imposed on a material for forming the insulating films 16 so far as it has insulating property and is flexible, and a resin material such as polyimide or liquid crystal polymer, or a composite material thereof may be used. However, polyimide is preferably used in that through-holes for the electrode structures can be easily formed by an etching treatment in the production process, which will be described subsequently.

As other materials for forming the insulating films 16, may be used meshes or nonwoven fabrics, or those obtained by impregnating these with a resin or elastic polymeric substance. As fibers for forming such meshes or nonwoven fabrics, may be used organic fibers such as aramide fiber, polyethylene fiber, polyarylate fiber, nylon fiber, fluorocarbon resin fibers such as Teflon (trademark) fiber, and polyester fiber. Such a material is used as a material for forming the insulating films 16, whereby the flexibility of all the contact films 15 is not greatly deteriorated even when the electrode structures 17 are arranged at a small pitch, so that a scatter of projected height in the electrode structures 17 or projected height in the electrodes to be inspected is sufficiently absorbed by the flexibility that the contact films 15 have if any, and so stable electrical connection to each of the electrodes to be inspected can be surely achieved.

No particular limitation is imposed on the thickness of the insulating film 16 so far as the flexibility of the insulating film 16 is not impaired.

However, it is preferably 5 to 150 µm, more preferably 7 to 100 µm, still more preferably 10 to 50 µm.

As a material for forming the electrode structures 17, may be used nickel, iron, copper, gold, silver, palladium, iron, cobalt, tungsten, rhodium, or an alloy or alloy steel thereof. The electrode structures 17 may be any of those formed of a simple metal as a whole, those formed of an alloy or alloy steel of at least two metals and those obtained by laminating at least two metals.

When electrical inspection is conducted on electrodes to be inspected, on the surfaces of which an oxide film has been formed, it is necessary to bring each of the electrode structures 17 of the sheet-like probe into contact with its corresponding electrode to be inspected to break the oxide film on the surface of the electrode to be inspected by the front-surface electrode part 17*a* of the electrode structure 17, thereby achieving electrical connection between the electrode structure 17 and the electrode to be inspected. Therefore, the front-surface electrode part 17*a* of the electrode structure 17 preferably has such hardness that the oxide film can be easily broken. In order to obtain such front-surface electrode parts 17*a*, a powdery material having high hardness may be contained in a metal forming the front-surface electrode parts 17*a*.

As such a powdery material, may be used diamond powder, silicon nitride, silicon carbide, ceramic, glass or the like. A proper amount of such a non-conductive powdery material is contained, whereby the oxide film formed on the surface of the electrode to be inspected can be broken by the front-surface electrode part 17*a* of the electrode structure 17 without impairing the conductivity of the electrode structure 17.

In order to easily break the oxide film on the surface of the electrode to be inspected, the front-surface electrode part 17*a* in the electrode structure 17 may be shaped into a sharply projected form, or fine irregularities may be formed in the surface of the front-surface electrode part 17*a*.

A pitch p between the electrode structures 17 in the contact film 15 is preset according to a pitch between electrodes to be inspected in a wafer, which is an object of inspection and, for example, preferably 40 to 250 µm, more preferably 40 to 150 µm.

The term "pitch between electrode structures" as used herein means the shortest center distance between adjoining electrode structures.

In the electrode structure 17, a ratio of a projected height to a diameter R in the front-surface electrode part 17*a* is preferably 0.2 to 3, more preferably 0.25 to 2.5. By satisfying such conditions, electrode structures 17 of a pattern corresponding to a pattern of electrodes to be inspected can be easily formed even when the electrodes to be inspected are small in pitch and fine, and a stable electrically connected state to such a wafer can be surely achieved.

The diameter R of the front-surface electrode part 17*a* is preferably 1 to 3 times, more preferably 1 to 2 times as large as the diameter r of the short circuit part 17*c*.

The diameter R of the front-surface electrode part 17*a* is also preferably 30 to 75%, more preferably 40 to 60% of the pitch p between the electrode structures 17.

The outer diameter L of each back-surface electrode part 17*b* is only required to be greater than the diameter of the short circuit part 17*c* and smaller than the pitch p between the electrode structures 17, and is preferably great as much as possible. Stable electrical connection can be thereby achieved with certainty even to, for example, an anisotropically conductive sheet.

The diameter r of the short circuit part 17*c* is preferably 15 to 75%, more preferably 20 to 65% of the pitch p between the electrode structures 17.

The specific dimensions of each of the electrode structures will be described. The projected height of the front-surface electrode part 17*a* is preferably 15 to 50 µm, more preferably 15 to 30 µm in that stable electrical connection to its corresponding electrode to be inspected can be achieved.

The diameter R of the front-surface electrode part 17*a* is preset in view of the above-described conditions, the diameter of its corresponding electrode to be inspected, and the like. However, it is, for example, preferably 30 to 200 µm, more preferably 35 to 150 µm.

The diameter r of the short circuit part 17*c* is preferably 10 to 120 µm, more preferably 15 to 100 µm in that sufficiently high strength is achieved.

The thickness of the back-surface electrode part 17*b* is preferably 15 to 150 µm, more preferably 20 to 100 µm in that sufficiently high strength and excellent repetitive durability are achieved.

A coating film may be formed on the front-surface electrode part 17*a* and back-surface electrode part 17*b* in each of the electrode structures 17 as needed. When the electrodes to be inspected are formed of, for example, a solder material, a coating film composed of a diffusion-resistant metal such as silver, palladium or rhodium is formed on the front-surface electrode part 17*a* from the viewpoint of preventing diffusion of the solder material.

Such a sheet-like probe 10 can be produced in the following manner.

As illustrated in FIG. 7, a circular laminate material 15A with a resin sheet 16A for insulating films integrally laminated on one surface of a metal foil 18A for back-surface electrode parts, which is composed of the same material as back-surface electrode parts 17*b* in electrode structures 17 to be formed, is first provided.

On the other hand, as illustrated in FIG. 8, a circular frame plate 11, in which a plurality of openings 12 have been formed corresponding to a pattern of electrode regions, in which electrodes to be inspected of integrated circuits in a wafer, which is an object of inspection, have been formed, is produced, and a protecting tape 20 is arranged on one surface of this frame plate 11 along a peripheral edge portion thereof. As a method for forming the openings 12 in the frame plate 11, may be utilized an etching method or the like.

Figure 10:
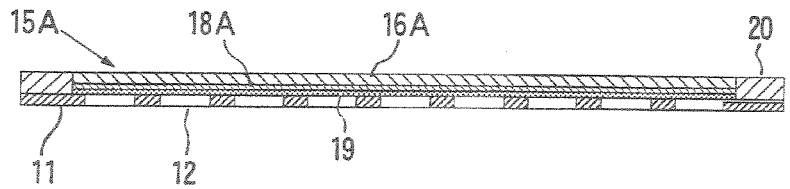
FIG. 10 is a cross-sectional view illustrating a state that the frame plate has been bonded to the metal foil for back-surface electrode parts in the laminate material.
Figure 11:
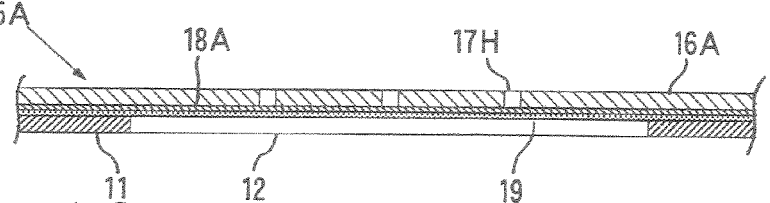
FIG. 11 is a cross-sectional view illustrating a state that through-holes have been formed in a resin sheet for insulating films in the laminate material.

As illustrated in FIG. 9, an adhesive layer 19 composed of, for example, an adhesive resin is then formed on the other surface of the metal foil 18 for back-surface electrode parts in the laminate material 15A, and the frame plate, on which the protecting tape 20 has been provided, is bonded thereto as illustrated in FIG. 10. Thereafter, as illustrated in FIG. 11, a plurality of through-holes 17H each extending through in a thickness-wise direction of the sheet are formed in the resin sheet 16A for insulating films in the laminate material 15A in accordance with a pattern corresponding to a pattern of the electrode structures to be formed. As a method for forming the through-holes 17H in the resin sheet 16A for insulating films, may be utilized laser beam machining, etching or the like.

Figure 12:
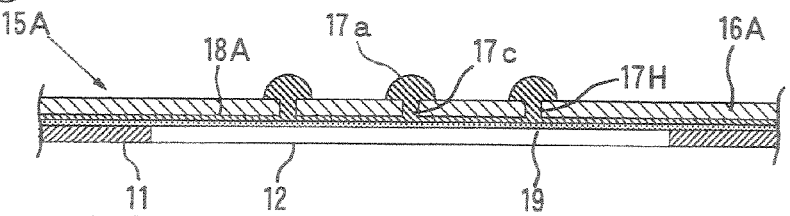
FIG. 12 is a cross-sectional view illustrating a state that short circuit parts and front-surface electrode parts have been formed in the resin sheet for insulating films.
Figure 13:
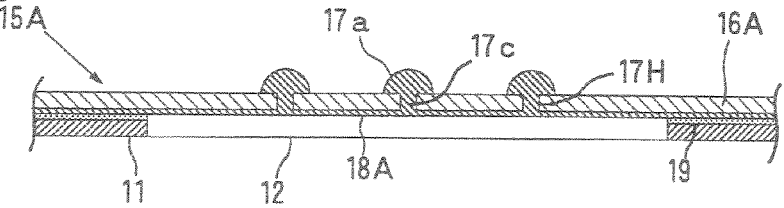
FIG. 13 is a cross-sectional view illustrating a state that parts of the adhesive layer have been removed to expose the metal foil for back-surface electrode parts.
Figure 14:
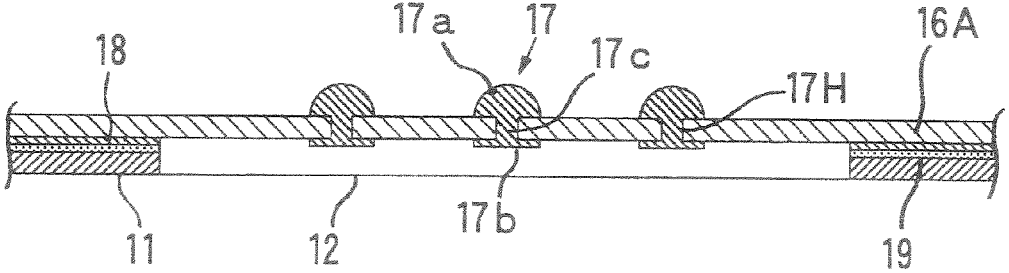
FIG. 14 is a cross-sectional view illustrating a state that back-surface electrode parts have been formed.
Figure 15:
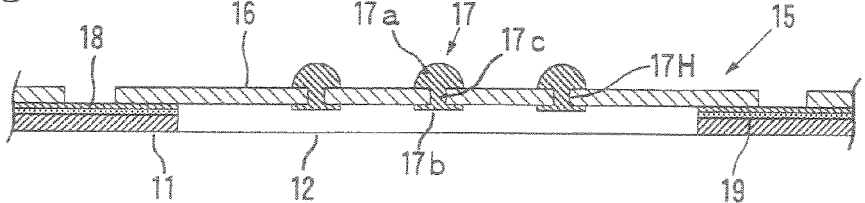
FIG. 15 is a cross-sectional view illustrating a state that insulating films have been formed

Then, the back surface and opening 12 of the frame plate 11 are covered with a protecting tape (not illustrated), and the metal foil 18A for back-surface electrode parts in the laminate material 15A is subjected to a plating treatment, thereby respectively forming short circuit parts 17c Integrally linked to the metal foil 18A for back-surface electrode parts within the through-holes 17H formed in the resin sheet 16A for insulating films and at the same time, forming front-surface electrode parts 17a integrally linked to the respective short circuit parts 17c and protruding from the surface of the resin sheet 16A for insulating films as illustrated in FIG. 12. Thereafter, the protecting tape is removed from the frame plate 11, portions of the adhesive layer 19, which are exposed to the openings 12 in the frame plate 11, are removed as illustrated in FIG. 13, thereby exposing parts of the metal foil 18A for back-surface electrode parts. The exposed parts of the metal foil 18A for back-surface electrode parts are subjected to an etching treatment, thereby forming a plurality of back-surface electrode parts 17b integrally linked no the respective short circuit parts 17c, thus forming the electrode structures 17. The resin sheet 16A for insulating films is then subjected to an etching treatment to remove a part thereof, thereby forming a plurality of insulating films 16 independent of each other as illustrated in FIG. 15, thus forming a plurality of contact films 15 each composed of an insulating film 16 and a plurality of electrode structures 17 arranged in the insulating film 16 and extending through in a thickness-wise direction of the film.

The protecting tape 20 (see FIG. 8) is removed from the frame plate 11, and a holding member is then arranged and fixed no a peripheral edge portion on the back surface of the frame plate 11, thereby obtaining the sheet-like probe illustrated in FIG. 3 to FIG. 5.

Figure 16:
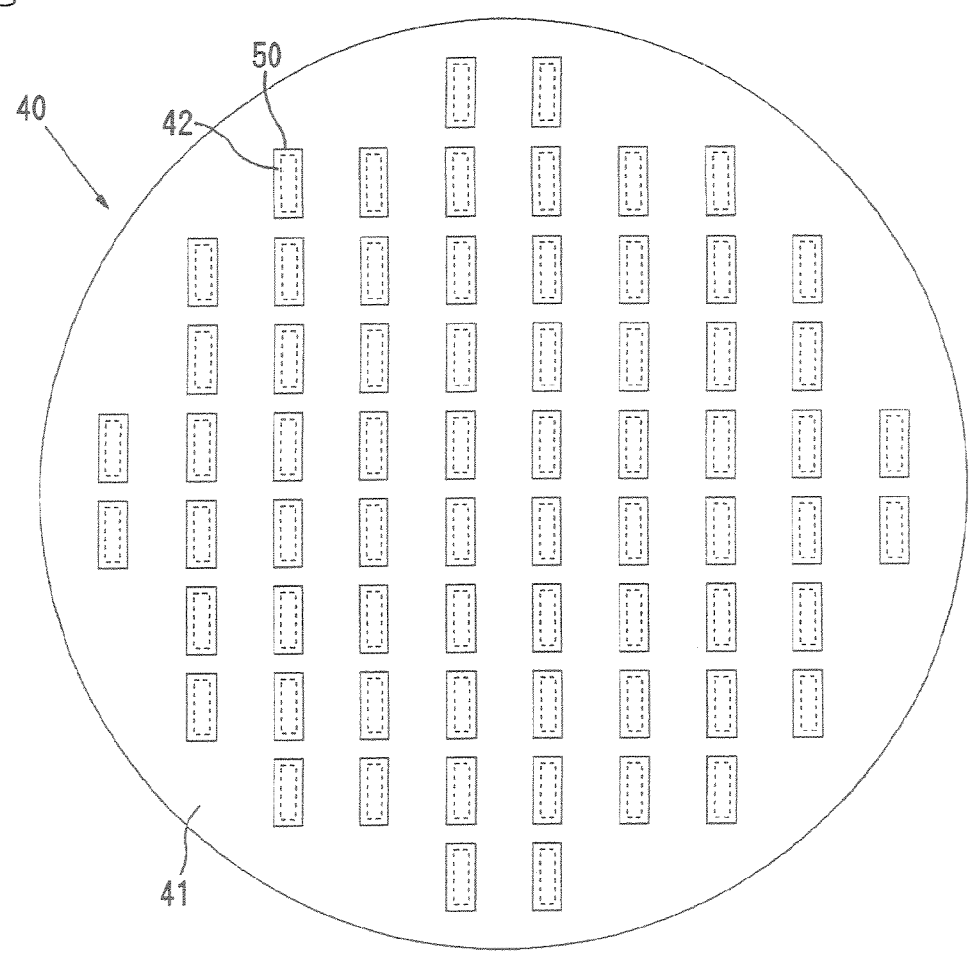
FIG. 16 is a plan view illustrating an anisotropically conductive connector in the first exemplary probe member.

The anisotropically conductive connector 40 has a circular frame plate 41, in which a plurality of openings 42 each extending in a thickness-wise direction of the frame plate have been formed, as illustrated in FIG. 16. The openings 42 in this frame plate 41 are formed corresponding to a pattern of electrode regions, in which electrodes to be inspected in all integrated circuits formed on the wafer, which is the object of inspection, have been formed. In the frame plate 41, a plurality of elastic anisotropically conductive films 50 having conductivity in a thickness-wise direction thereof are arranged in a state supported by their corresponding opening edges of the frame plate 41 so as to close the respective openings 42.

Each of the elastic anisotropically conductive films 50 is formed of an elastic polymeric substance as a base material and has a functional part 51 composed of a plurality of conductive parts 52 for connection extending in a thickness-wise direction of the film and an insulating part 53 formed around the conductive parts 52 for connection and mutually insulating the conductive parts 52 for connection. The functional part 51 is arranged so as to be located in the opening 42 of the frame plate 41. The conductive parts 52 for connection in the functional part 51 are arranged in accordance with a pattern corresponding to a pattern of the electrodes to be inspected in an electrode region of an integrated circuit formed on the wafer, which is the object of inspection.

At a peripheral edge of the functional part 51, a part 55 to be supported, which is fixed to and supported by an edge portion of the opening in the frame plate 41, is formed integrally and continuously with the functional part 51. More specifically, the part 55 to be supported in this embodiment is shaped in a forked form and fixed and supported in a closely contacted state so as to grasp the edge portion of the opening in the frame plate 41.

In the conductive parts 52 for connection in the functional part 51 of the elastic anisotropically conductive film 50, conductive particles P exhibiting magnetism are densely contained in a state oriented so as to align in the thickness-wise direction. On the other hand, the insulating part 53 does not contain the conductive particles P at all or scarcely contain them.

In the illustrated embodiment, projected portions 54 protruding from other surfaces than portions, at which the conductive parts 52 and peripheral portions thereof are located, are formed at those portions on both surfaces of the functional part 51 in the elastic anisotropically conductive film 50.

The thickness of the frame plate 41 varies according to the material thereof, but is preferably 20 to 600 µm, more preferably 40 to 400 µm.

If this thickness is smaller than 20 µm, the strength required upon use of the resulting anisotropically conductive connector 40 is not achieved, and the durability thereof is liable to become low. In addition, such stiffness as the form of the frame plate 41 is retained is not achieved, and the handling property of the anisotropically conductive connector 40 becomes low. If the thickness exceeds 600 µm on the other hand, the elastic anisotropically conductive films 50 formed in the openings 42 become too great in thickness, and it may be difficult in some cases to achieve good conductivity in the conductive parts 52 for connection and insulating property between adjoining conductive parts 52 for connection.

The form and size in a plane direction of the openings 42 in the frame plane 41 are designed according to the size, pitch and pattern of electrodes to be inspected in a wafer chat is an object of inspection.

No particular limitation is imposed on a material for forming the frame plate 41 so far as it has such stiffness as the resulting frame plate 41 is hard to be deformed, and the form thereof is stably retained. For example, various kinds of materials such as metallic materials, ceramic materials and resin materials may be used. When the frame plate 41 is formed by, for example, a metallic material, an insulating film may also be formed on the surface of the frame plate 41.

Specific examples of the metallic material for forming the frame plate 41 include metals such as iron, copper, nickel, titanium and aluminum, and alloys or alloy steels composed of a combination of at least two of these metals.

As the material for forming the frame plate 41, is preferably used a material having a coefficient of linear thermal expansion of at most $3\times10^{-5}$/K, more preferably $-1\times10^{-7}$ to $1\times10^{-5}$/K, particularly preferably $1\times10^{-6}$ to $8\times10^{-6}$/K.

Specific examples of such a material include invar alloys such as invar, Elinvar alloys such as Elinvar, and alloys or alloy steels of magnetic metals, such as superinvar, covar and 42 alloy.

The overall thickness (thickness of the conductive part 52 for connection in the illustrated embodiment) of the elastic anisotropically conductive film 50 is preferably 50 to 3,000 µm, more preferably 70 to 2,500 µm, particularly preferably 100 to 2,000 µm. When this thickness is 50 µm or greater, elastic anisotropically conductive films 50 having sufficient strength are provided with certainty. When this thickness is 3,000 µm or smaller on the other hand, conductive parts 52 for connection having necessary conductive properties are provided with certainty.

The projected height of the projected parts 54 is preferably at least 10% in total of the thickness of the conductive part for connection including the projected parts 54, more preferably at least 20%. Projected parts 54 having such a projected height are formed, whereby the conductive parts 52 are sufficiently compressed by small pressurizing force, so that good conductivity is surely achieved.

The projected height of the projected part 54 is preferably at most 100%, more preferably at most 70% of the shortest width or diameter of the projected part 54. Projected parts 54 having such a projected height are formed, whereby the projected parts 54 are not buckled when they are pressurized, so that the expected conductivity is surely achieved.

The thickness (thickness of one of the forked portions in the illustrated embodiment) of the part 55 to be supported is preferably 5 to 600 μm, more preferably 10 to 500 μm, particularly preferably 20 to 400 μm.

It is not essential that the part 55 to be supported is formed in the forked form, and the elastic anisotropically conductive film may also be fixed to only one surface of the frame plate 41.

The elastic polymeric substance forming the anisotropically conductive films 50 is preferably a heat-resistant polymeric substance having a crosslinked structure. Various materials may be used as curable polymeric substance-forming materials usable for obtaining such crosslinked polymeric substances. Specific examples thereof include silicone rubber; conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and besides chloroprene, urethane rubber, polyester rubber, epichlorohydrin rubber, ethylene-propylene copolymer rubber, ethylene-propylene-diene terpolymer rubber and soft liquid epoxy rubber.

Among these, silicone rubber is preferred from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those containing a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinyl-alkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinyisiloxane as a polymerization terminator and suitably selecting other reaction conditions (for example, amounts of the cyclic siloxane and polymerization terminator). As the catalyst for the anionic polymerization used herein, may be used an alkali such as tetramethylammonium hydroxide or n-butylphosphonium hydroxide, or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 from the viewpoint of the heat resistance of the resulting elastic anisotropically conductive films 50.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and then fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosilane, methyldihydrochiorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 no 130° C.

Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting elastic anisotropically conductive films 50.

In the present invention, any one of the above-described vinyl group-containing dimethyl polysiloxane and hydroxyl group-containing dimethyl polysiloxane may be used, or both may also be used in combination.

A curing catalyst for curing the polymeric substance-forming material may be contained in the polymeric substance-forming material. As such a curing catalyst, may be used an organic peroxide, fatty acid azo compound, hydrosilylation catalyst or the like.

Specific examples of the organic peroxide used as the curing catalyst include benzoyl peroxide, bisdieyclobenzoyl peroxide, dicumyl peroxide and di-tert-butyl peroxide.

Specific examples of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphite and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, in is generally 3 to 15 parts by weight per 100 parts by weight of the polymeric substance-forming material.

As the conductive particles P contained in she conductive parts 52 for connection in the elastic anisotropically conductive films 50, those exhibiting magnetism are preferably used in that such conductive particles P can be easily moved in a molding material for forming the elastic anisotropically conductive films 50 in the formation of the elastic anisotropically conductive films 50. Specific examples of such conductive particles P exhibiting magnetism include particles of metals exhibiting magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, particles obtained by using particles of a non-magnetic metal, particles of an inorganic substance, such as glass beads, or particles of a polymer as core particles and plating surfaces of the core particles with a conductive magnetic substance such as nickel or cobalt, and particles obtained by coating the core particles with both conductive magnetic substance and good-conductive metal.

Among these, particles obtained by using nickel particles as core particles and plating their surfaces with a metal having good conductivity, such as gold or silver are preferably used.

No particular limitation is imposed on a means for coating the surfaces of the core particles with the conductive metal. However, for example, the coating may be conducted by electroless plating.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to be coated is preferably 2.5 to 50% by weight, more preferably 3 to 45% by weight, still more preferably 3.5 to 40% by weight, particularly preferably 5 to 30% by weight based on the core particles.

The particle diameter of the conductive particles P is preferably 1 to 500 μm, more preferably 2 to 400 μm, still more preferably 5 to 300 μm, particularly preferably 10 to 150 μm.

The particle diameter distribution (Dw/Dn) of the conductive particles P is preferably 1 to 10, more preferably 1 to 7, still more preferably 1 to 5, particularly preferably 1 to 4.

Conductive particles satisfying such conditions are used, whereby the resulting elastic anisotropically conductive films 50 become easy to deform under pressure, and sufficient electrical contact is achieved among the conductive particles P in the conductive parts 52 for connection in the elastic anisotropically conductive films 50.

Conductive particles P having such an average particle diameter can be prepared by subjecting conductive particles and/or core particles to form the conductive particles to a classification treatment by means of a classifier such as an air classifier or sonic classifier. Specific conditions for the classification treatment are suitably preset according to the intended average particle diameter and particle diameter distribution of the conductive particles, the kind of the classifier, and the like.

No particular limitation is imposed on the shape of the conductive particles P. However, they are preferably in the shape of a sphere or star, or a mass of secondary particles obtained by agglomerating these particles from the viewpoint of permitting easy dispersion of these particles in the polymeric substance-forming material.

The water content in the conductive particles P is preferably at most 5%, more preferably at most 3%, still more preferably at most 2%, particularly preferably at most 1%. The use of the conductive particles P satisfying such conditions can prevent or inhibit the occurrence of bubbles in a molding material layer upon a curing treatment of the molding material layer.

Those obtained by treating surfaces of the conductive particles P with a coupling agent such as a silane coupling agent may be suitably used. By treating the surfaces of the conductive particles P with the coupling agent, the adhesion property of the conductive particles P to the elastic polymeric substance is improved, so that the resulting elastic anisotropically conductive films 50 become high in durability in repeated use.

The amount of the coupling agent used is suitably selected within limits not affecting the conductivity of the conductive particles P. However, it is preferably such an amount that a coating rate (proportion of an area coated with the coupling agent to the surface area of the conductive core particles) of the coupling agent on the surfaces of the conductive particles P amounts to at least 5%, more preferably 7 to 100%, further preferably 10 to 100%, particularly preferably 20 to 100%.

The proportion of the conductive particles P contained in the conductive parts 52 for connection in the functional part 51 is preferably 10 to 60%, more preferably 15 to 50% in terms of volume fraction. If this proportion is lower than 10%, conductive parts 52 for connection sufficiently low in electric resistance value may not be obtained in some cased. If the proportion exceeds 60% on the other hand, the resulting conductive parts 52 for connection are liable to be brittle, so that elasticity required of the conductive parts 52 for connection may not be achieved in some cases.

In the polymeric substance-forming material, as needed, may be contained a general inorganic filler such as silica powder, colloidal silica, aerogel silica or alumina. By containing such an inorganic filler, the thixotropic property of the resulting molding material is secured, the viscosity thereof becomes high, the dispersion stability of the conductive particles P is improved, and moreover the strength of the elastic anisotropically conductive films 50 obtained by a curing treatment becomes high.

No particular limitation is imposed on she amount of such an inorganic filler used. However, the use in a too large amount is not preferred because the movement of the conductive particles P by a magnetic field is greatly inhibited in a production process, which will be described subsequently.

Such an anisotropically conductive connector 40 can be produced in accordance with the process described in, for example, Japanese Patent Application Laid-Open No, 2002-334732.

In the probe member 1 according to the first embodiment, each of the openings 12 of the frame plate 11 in the sheet-like probe 10 has a size capable of receiving the external shape in a plane direction in the elastic anisotropically conductive film 50 of the anisotropically conductive connector 40. More specifically, since the opening 12 of the frame plate 11 in the sheet-like probe 10 is rectangular, and the external shape in the plane direction in the elastic anisotropically conductive film 50 is also rectangular, the dimensions in length and width of the opening 12 of the frame plate 11 in the sheet-like probe 10 are set greater than the dimensions in length and width of the elastic anisotropically conductive film 50.

A ratio h/d of a gap h between the level of the front surface (upper surface in FIG. 2) of the frame plate 41 in the anisotropically conductive connector 40 and the level of the front surface-side end surface (upper surface in FIG. 2) of the conductive part 52 for connection in the elastic anisotropically conductive film 50 to a gap d between the level of the back surface (lower surface in FIG. 2) of the frame plate 11 in the sheet-like probe 10 and the level of the electrode surface (lower surface in FIG. 2) of the back-surface electrode part is preferably at least 1.2, more preferably at least 1.5, particularly preferably at least 1.8. If this ratio h/d is lower than 1.2, the frame plate 11 in sheet-like probe 10 comes into contact with the frame plate 41 of the anisotropically conductive connector 40 when the conductive parts 52 for connection are pressed in thickness-wise direction by the back-surface electrode parts 17b, so that the conductive parts 52 for connection are not sufficiently compressed. As a result, necessary conductivity may not be achieved in some cases in the conductive parts 52 for connection.

According to the probe member 1 of the first embodiment, each of the openings 12 of she frame plane 11 in the sheet-like probe 10 is formed into the size capable of receiving the external shape in the plane direction in the elastic anisotropically conductive film 50 of the anisotropically conductive connector 40, whereby it is avoided for the frame plate 11 of the sheet-like probe 10 to come into contact with the elastic anisotropically conductive film 50 of the anisotropically conductive connector 40 when the electrode structures 17 of the sheet-like probe 10 are pressurized, so that the conductive parts 52 for connection of the elastic anisotropically conductive film 50 can be sufficiently compressed in the thickness-wise direction of the film. As a result, a good electrically connected state to the wafer can be surely achieved.

According to the above-described probe member, the contact film 15 having the electrode structures 17 is arranged and supported in each of the plural openings 12 formed in the frame plate 11 of the sheet-like probe 10, whereby each of the contact films 15 may be small in area, and the contact film 15 small in area is little in the absolute quantity of thermal expansion in the plane direction of the insulating film 16 thereof, so that positional deviation between the electrode structures 17 and the electrodes to be inspected by temperature change can be surely prevented even when the wafer, which is the object of inspection, has a large area of 8 inches or greater in diameter, and the pitch of the electrodes to be inspected is extremely small. In addition, the elastic anisotropically conductive film 50 is arranged and supported in each of the plural openings 12 formed in the frame plate 41 of the anisotropically conductive connector 40, whereby each of the elastic anisotropically conductive films 50 may be small in area, and the elastic anisotropically conductive film 50 small in area is little in the absolute quantity of thermal expansion in the plane direction thereof, so that positional deviation between the conductive parts for connection and the electrode structures by temperature change can be surely prevented even when the wafer, which is the object of inspection, has a large area of 8 inches or greater in diameter, and the pitch of the electrodes to be inspected is extremely small. Accordingly, a good electrically connected state to the wafer can be stably retained in a burn-in test.

Furthermore, the value of the ratio h/d is controlled to at least 1.2, whereby the conductive parts 52 for connection in the elastic anisotropically conductive films 50 can be sufficiently compressed in the thickness-wise direction thereof when the electrode structures 17 of the sheet-like probe 10 are pressurized, so that a good electrically connected state to the wafer can be achieved with more certainty.

Figure 17:
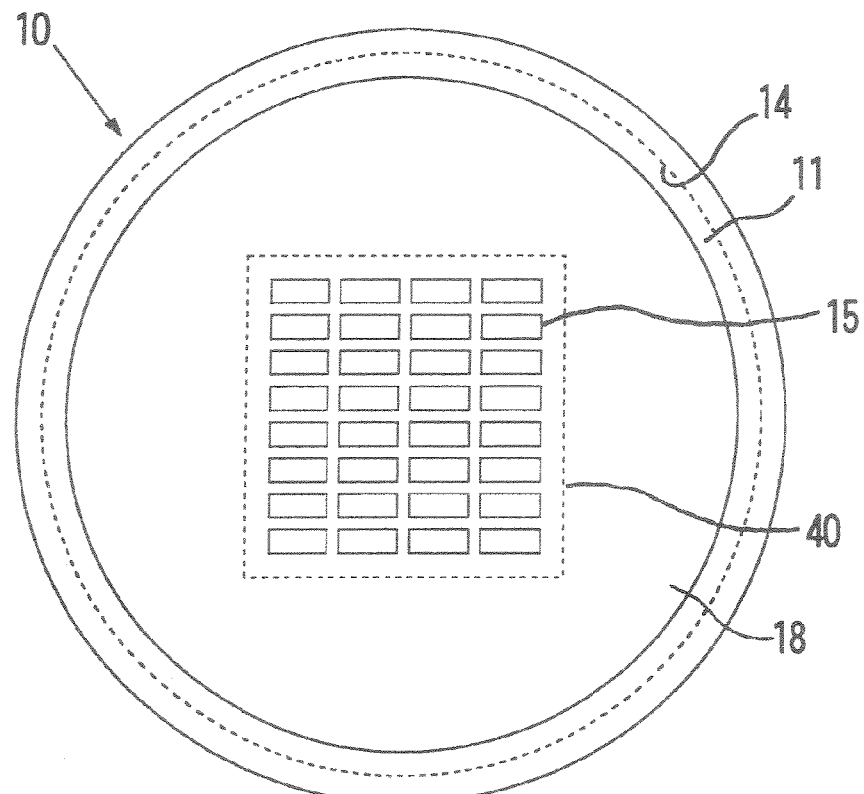
FIG. 17 is a plan view illustrating a second exemplary probe member according to the present invention.
Figure 18:
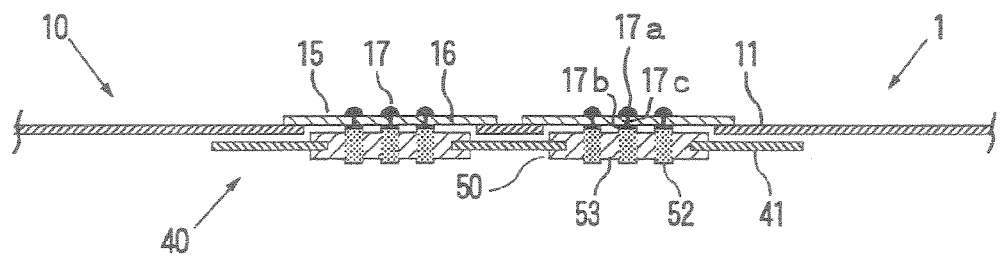
FIG. 18 is a cross-sectional view illustrating the construction of the second exemplary probe member.

FIG. 17 is a plan view illustrating a probe member according to a second embodiment of the present invention, and FIG. 18 is a cross-sectional view illustrating the construction of a principal part of the probe member of the second embodiment.

The probe member 1 according to the second embodiment is used for collectively conducting a probe test of, for example, a wafer, on which a plurality of integrated circuits have been formed, as to each of the integrated circuits in a state of the wafer, and is constructed by a sheet-like probe 10 and an anisotropically conductive connector 40 arranged on a back surface of the sheet-like probe 10.

Figure 19:
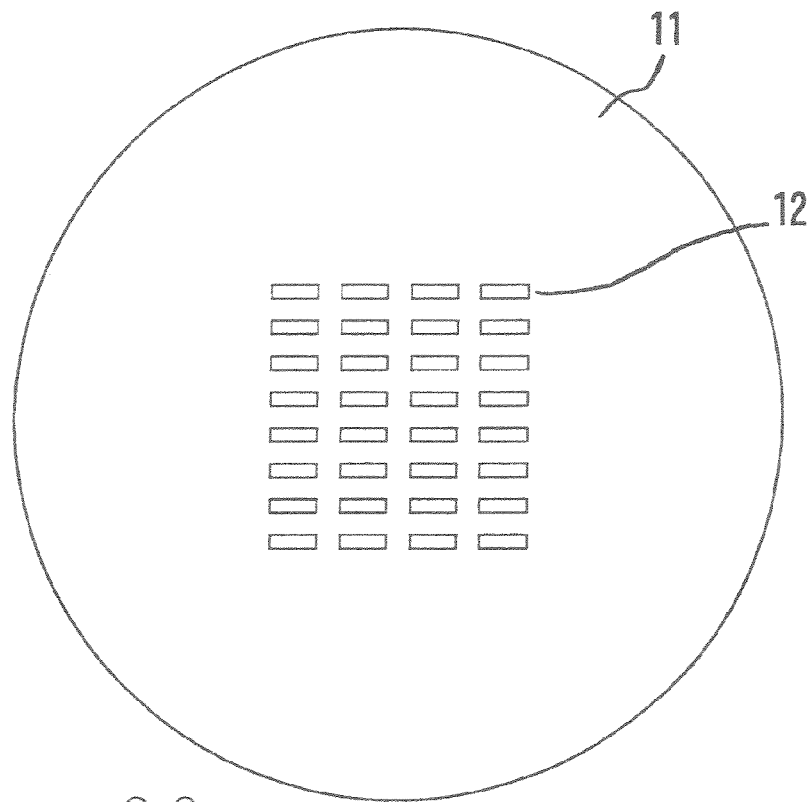
FIG. 19 is a plan view illustrating a frame plate of the sheet-like probe in the probe member according to the second embodiment.

The sheet-like probe 10 in the probe member of the second embodiment has a metal-made frame plate 11, in which a plurality of openings have been formed, as also illustrated in FIG. 19. The openings 12 in this frame plate 11 are formed corresponding to a pattern of electrode regions, in which electrodes to be inspected in, for example, 32 (8×4) integrated, circuits among integrated circuits formed on a wafer, which is an object of inspection, have been formed. Other constructions in this sheet-like probe 10 are the same as those in the sheet-like probe 10 of the probe member 1 according to the first embodiment (see FIG. 4 and FIG. 5).

The sheet-like probe 10 in the probe member 1 according to the second embodiment can be produced in the same manner as in the sheet-like probe according no the first embodiment.

Figure 20:
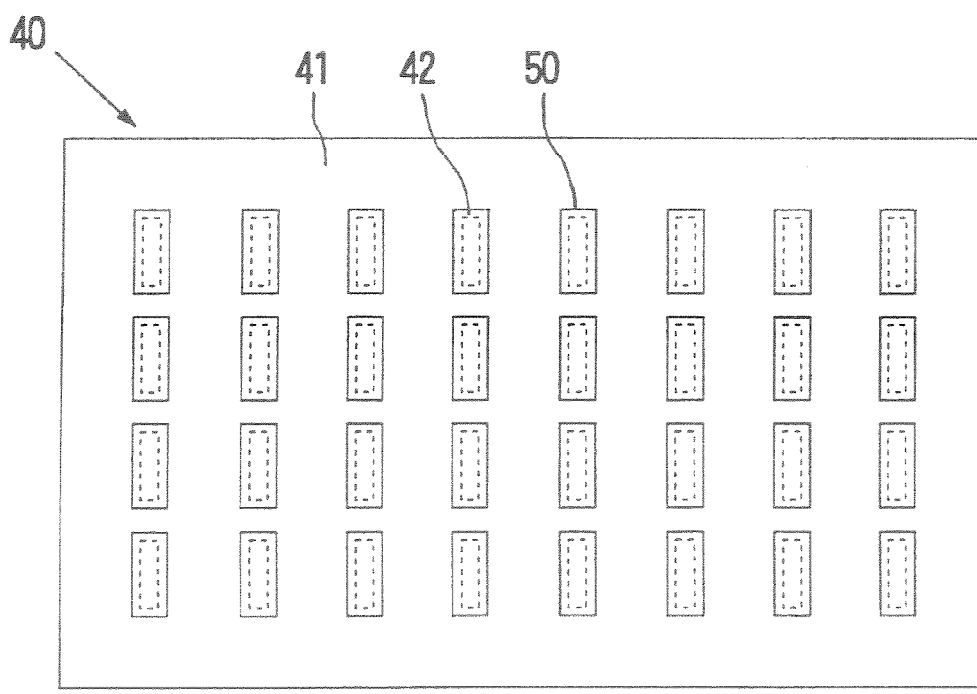
FIG. 20 is a plan view illustrating an anisotropically conductive connector in the second exemplary probe member.

The anisotropically conductive connector 40 has a rectangular plate-like frame plate 41, in which a plurality of openings 42 each extending in a thickness-wise direction of the frame plate have been formed, as illustrated in FIG. 20. The openings 42 in this frame plate 41 are formed corresponding to a pattern of electrode regions, in which electrodes to be inspected in, for example, 32 (8×4) integrated circuits among the integrated circuits formed on the wafer, which is the object of inspection, have been formed. In the frame plate 41, a plurality of elastic anisotropically conductive films 50 having conductivity in a thickness-wise direction thereof are arranged in a state supported by their corresponding opening edges of the frame plate 41 so as to close the respective openings 42. Other constructions in the anisotropically conductive connector 40 are the same as those in the anisotropically conductive connector 40 of the probe member 1 according to the first embodiment (see FIG. 15).

In the probe member 1 according to the second embodiment, each of the openings 12 of the frame plate 11 in the sheet-like probe 10 has a size capable of receiving the external shape in a plane direction in the elastic anisotropically conductive film 50 of the anisotropically conductive connector 40. More specifically, since the opening 12 of the frame plate 11 in the sheet-like probe 10 is rectangular, and the external shape in the plane direction in the elastic anisotropically conductive film 50 is also rectangular, the dimensions in length and width of the opening 12 of the frame plate 11 in the sheet-like probe 10 are set greater than the dimensions in length and width of the elastic anisotropically conductive film 50.

A ratio h/d of a gap h between the level of the front surface (upper surface in FIG. 18) of the frame plate 41 in the anisotropically conductive connector 40 and the level of the front surface-side end surface (upper surface in FIG. 18) of the conductive part 52 for connection in the elastic anisotropically conductive film 50 to a gap d between the level of the back surface (lower surface in FIG. 18) of the frame plate 11 in the sheet-like probe 10 and the level of the electrode surface (lower surface in FIG. 18) of the back-surface electrode part is preferably at least 1.2.

According to the probe member 1 of the second embodiment, each of the openings 12 of the frame plate 11 in the sheet-like probe 10 is formed into the size capable of receiving the external shape in the plane direction in the elastic anisotropically conductive film 50 of the anisotropically conductive connector 40, whereby it is avoided for the frame plate 11 of the sheet-like probe 10 to come into contact with the elastic anisotropically conductive film 50 of the anisotropically conductive connector 40 when the electrode structures 17 of the sheet-like probe 10 are pressurized, so that the conductive parts 52 for connection of the elastic anisotropically conductive film 50 can be sufficiently compressed in the thickness-wise direction of the film. As a result, a good electrically connected state to the wafer can be surely achieved.

According no the above-described probe member 1, the contact film 15 having the electrode structures 17 is arranged and supported in each of the plural openings 12 formed in the frame plate 11 of the sheet-like probe 10, whereby each of the contact films 15 may be small in area, and the contact film 15 small in area is little in the absolute quantity of thermal expansion in the plane direction of the insulating film 16 thereof, so that positional deviation between the electrode structures 17 and the electrodes to be inspected by temperature change can be surely prevented even when the wafer, which is the object of inspection, has a large area of 8 inches or greater in diameter, and the pitch of the electrodes to be inspected is extremely small. In addition, the elastic anisotropically conductive film 50 is arranged and supported in each of the plural openings 12 formed in the frame plate 41 of the anisotropically conductive connector 40, whereby each of the elastic anisotropically conductive films 50 may be small in area, and the elastic anisotropically conductive film 50 small in area is little in the absolute quantity of thermal expansion in the plane direction thereof, so that positional deviation between the conductive parts for connection and the electrode structures by temperature change can be surely prevented even when the wafer, which is the object of inspection, has a large area of 8 inches or greater in diameter, and the pitch of the electrodes to be inspected is extremely small. Accordingly, a good electrically connected state to the wafer can be stably retained in a probe test.

Furthermore, the value of the ratio h/d is controlled to at least 1.2, whereby the conductive parts 52 for connection in the elastic anisotropically conductive films 50 can be sufficiently compressed in the thickness-wise direction thereof when the electrode structures 17 of the sheet-like probe 10 are pressurized, so that a good electrically connected state to the wafer can be achieved with more certainty.

(Probe Card for Wafer Inspection)

Figure 21:
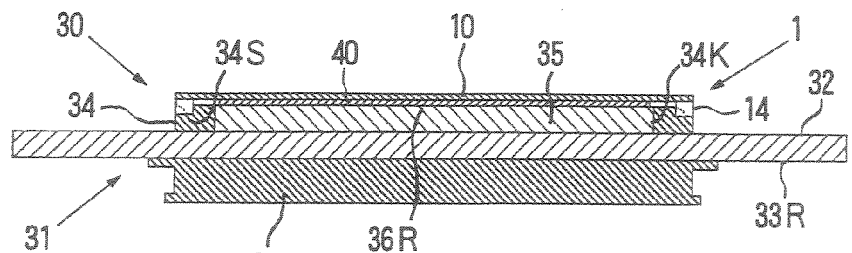
FIG. 21 is a cross-sectional view illustrating the construction of a first exemplary probe card according to the present invention.
Figure 22:
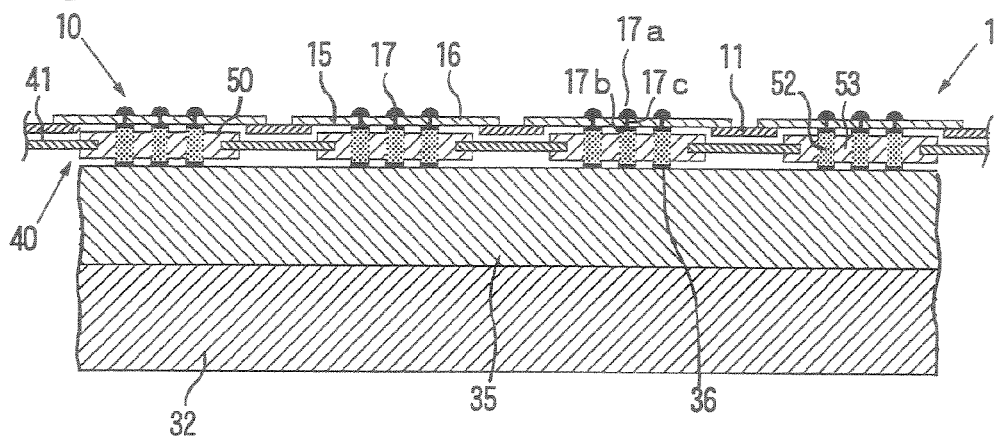
FIG. 22 is a cross-sectional view illustrating, on an enlarged scale, the construction of a principal part of the first exemplary probe card.

FIG. 21 is a cross-sectional view illustrating the construction of a probe card for wafer inspection (hereinafter referred to as "probe card" merely) according to the first embodiment of the present invention, and FIG. 22 is a cross-sectional view illustrating the construction of a principal part of the probe card according to the first embodiment.

The probe card 30 according to the first embodiment is used for collectively conducting a burn-in test on, for example, a wafer, on which a plurality of integrated circuits have been formed, as to each of the integrated circuits in a state of the wafer, and is constructed by a circuit board 31 for inspection and the probe member 1 according to the first embodiment, which is arranged on one surface (upper surface in FIG. 21 and FIG. 22) of the circuit board 31 for inspection.

Figure 23:
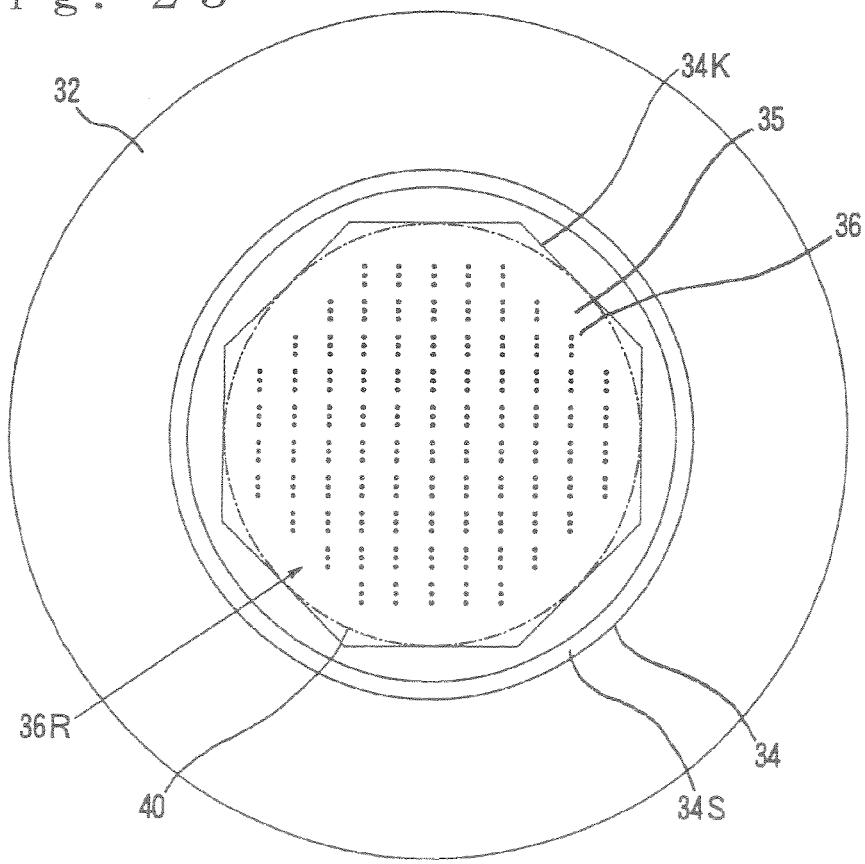
FIG. 23 is a plan view illustrating a circuit board for inspection in the first exemplary probe card.

As also illustrated in FIG. 23, the circuit board 31 for inspection has a disk-like first base element 32, and a regular-octagonal plate-like second base element 35 is arranged at a central portion on a front surface (upper surface in FIG. 21 and FIG. 22) of the first base element 32. This second base element 35 is held by a holder 34 fixed to the front surface of the first base element 32. A reinforcing member 37 is provided at a central portion on a back surface of the first base element 32.

Figure 24:
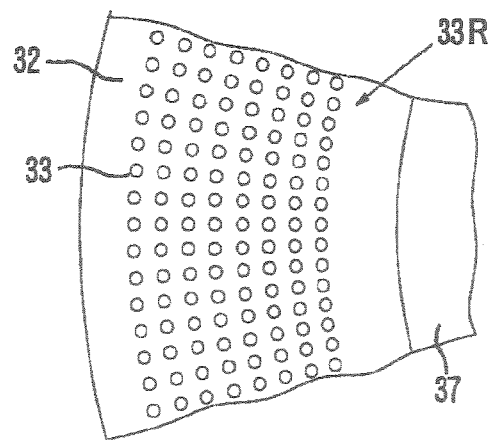
FIG. 24 illustrates, on an enlarged scale, a lead electrode part in the circuit board for inspection.

A plurality of connection electrodes (not illustrated) are formed in accordance with a proper pattern at a central portion on the front surface of the first base element 32. On the other hand, as illustrated in FIG. 24, a lead electrode part 33R, in which a plurality of lead electrodes 33 are arranged so as to align along a circumferential direction of the first base element 32, is formed at a peripheral edge portion on the back surface of the first base element 32. A pattern of the lead electrodes 33 is a pattern corresponding to a pattern of input-output terminals of a controller in a wafer inspection apparatus, which will be described subsequently. Each of the lead electrodes 33 is electrically connected to its corresponding connection electrode through an internal wiring (not illustrated).

An inspection electrode part 36R, in which a plurality of inspection electrodes 36 are arranged in accordance with a pattern corresponding to a pattern of electrode to be inspected in all integrated circuits formed on a wafer, which is an object of inspection, is formed on a front surface (upper surface in FIG. 21 and FIG. 22) of the second base element 35. On the other hand, a plurality of terminal electrodes (not illustrated) are arranged in accordance with a proper pattern on a back surface of the second base element 35, and each of the terminal electrodes is electrically connected to its corresponding inspection electrode through an internal wiring (not illustrated).

The connection electrodes of the first base element 32 are electrically connected to their corresponding terminal electrodes of the second base element 35 through a proper means.

As a base material for forming the first base element 32 in the circuit board 31 for inspection, may be used any of conventionally known various base materials, and specific examples thereof include composite resin base materials such as glass fiber-reinforced epoxy resins, glass fiber-reinforced phenol resins, glass fiber-reinforced polyimide resins and glass fiber-reinforced bismaleimide triazine resins.

As a material for forming the second base element 35 in the circuit board 31 for inspection, is preferably used a material having a coefficient of linear thermal expansion of at most $3 \times 10^{-5}$/K, more preferably $1 \times 10^{-7}$ to $1 \times 10^{-5}$/K, particularly preferably $1 \times 10^{-6}$ to $6 \times 10^{-6}$/K. Specific examples of such a base material include inorganic base materials composed of Pyrex (trademark) glass, quartz glass, alumina, beryllia, silicon carbide, aluminum nitride, boron nitride or the like, and laminated base materials obtained by using a metal plate formed of an iron-nickel alloy steel such as 42 alloy, covar or invar as a core material and laminating a resin such as an epoxy resin or polyimide resin thereon.

The holder 34 has a regular-octagonal opening 34K fitted to the external shape of the second base element 35, and the second base element 35 is housed in this opening 34K. A peripheral edge of the holder 34 is circular, and a step portion 34S is formed at the peripheral edge of the holder 34 along a circumferential direction thereof.

In the probe card 30 according to the first embodiment, the probe member 1 is arranged on the front surface of the circuit board 31 for inspection in such a manner that the conductive parts 52 for connection of the anisotropically conductive connector 40 come into contact with their corresponding inspection electrodes 36, and the holding member 14 of the sheet-like probe 10 is interlocked with and fixed to the step portion 34S of the holder 34.

According to such a probe card 30 of the first embodiment, the above-described probe member 1 according to the first embodiment is provided, so that a good electrically connected state to a wafer, which is an object of inspection, can be surely achieved even when the wafer has a large area of 8 Inches or greater in diameter, and the pitch of the electrodes to be inspected is extremely small, and moreover, in a burn-in test, positional deviation to the electrodes to be inspected by temperature change can be surely prevented, whereby the good electrically connected state to the wafer can be stably retained.

Figure 25:
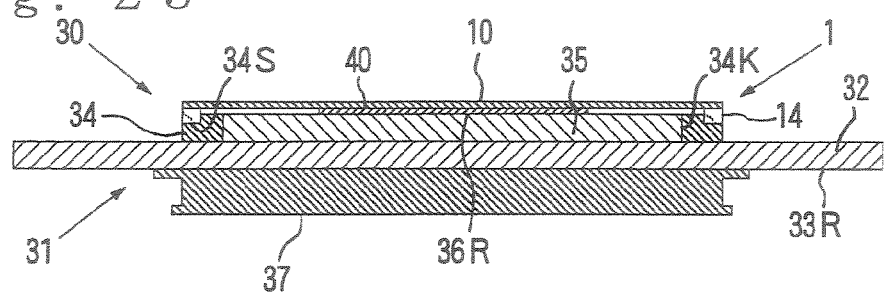
FIG. 25 is a cross-sectional view illustrating the construction of a second exemplary probe card according to the present invention.
Figure 26:
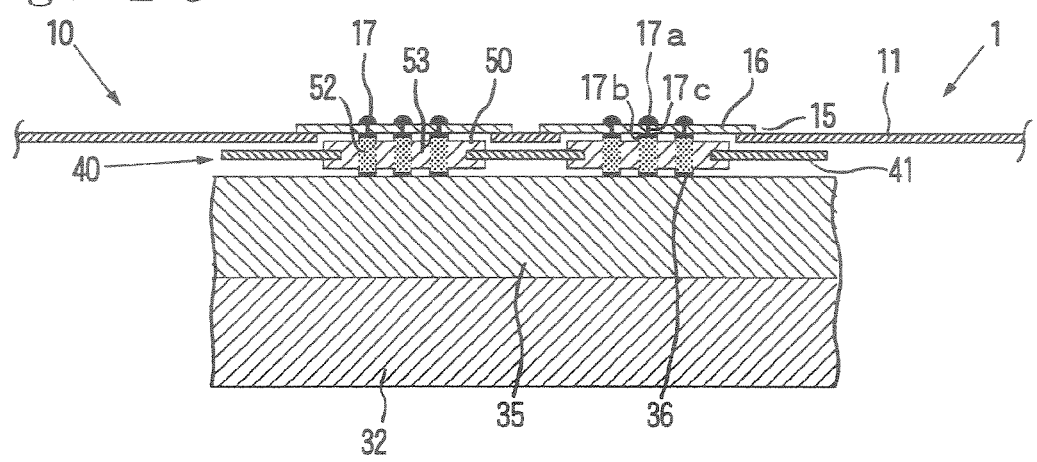
FIG. 26 is a cross-sectional view illustrating, on an enlarged scale, the construction of a principal part of the second exemplary probe card.

FIG. 25 is a cross-sectional view illustrating the construction of a probe card according to the second embodiment of the present invention, and FIG. 26 is a cross-sectional view illustrating she construction of a principal part of the probe card according to the second embodiment.

The probe card 30 according no the second embodiment is used for collectively conducting a probe test on, for example, a wafer, on which a plurality of integrated circuits have been formed, as to each of the integrated circuits in a state of the wafer, and is constructed by a circuit board 31 for inspection and the probe member 1 according to the second embodiment, which is arranged on one surface of the circuit board 31 for inspection.

Figure 27:
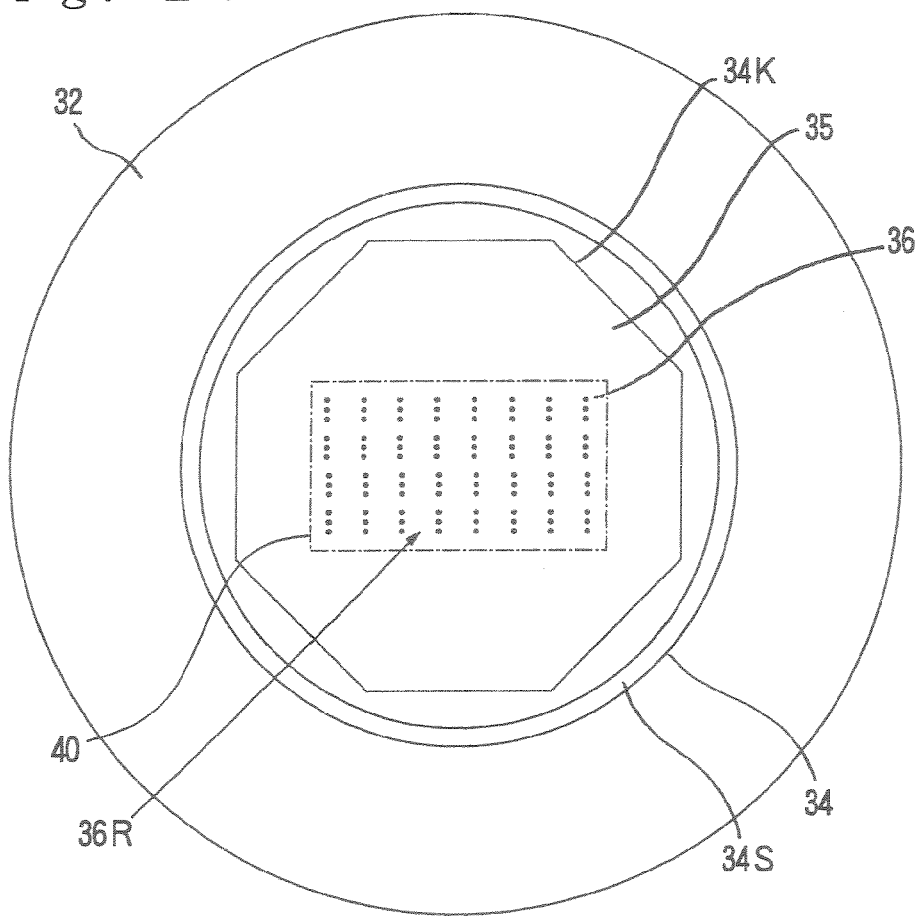
FIG. 27 is a plan view illustrating a circuit board for inspection in the second exemplary probe card.

As illustrated in FIG. 27, an inspection electrode part 36R, in which a plurality of inspection electrodes 36 are arranged in accordance with a pattern corresponding to a pattern of electrode to be inspected in, for example, 32 (8×4) integrated circuits among integrated circuits formed on a wafer, which is an object of inspection, is formed on a front surface of the second base element 35 in the circuit board 31 for inspection of the probe card 30 according to second embodiment. Other constructions in the circuit board 31 for inspection are fundamentally the same as those in the circuit board 31 for inspection in the probe card 30 according to the first embodiment.

In the probe card 30 according to the second embodiment, the probe member 1 is arranged on the front surface of the circuit board 31 for inspection in such a manner that the conductive parts 52 of the anisotropically conductive connector 40 come into contact with their corresponding inspection electrodes 36, and the holding member 14 of the sheet-like probe 10 is interlocked with and fixed to the step portion 34S of the holder 34.

According to such a probe card 30 of the second embodiment, the above-described probe member 1 according to the second, embodiment is provided, so that a good electrically connected state to a wafer, which is an object of inspection, can be surely achieved even when the wafer has a large area of 8 inches or greater in diameter, and the pitch of the electrodes to be inspected is extremely small, and moreover, in a probe test, positional deviation to the electrodes to be inspected by temperature change can be surely prevented, whereby the good electrically connected state to the wafer can be stably retained.

[Wafer Inspection Apparatus]

Figure 28:
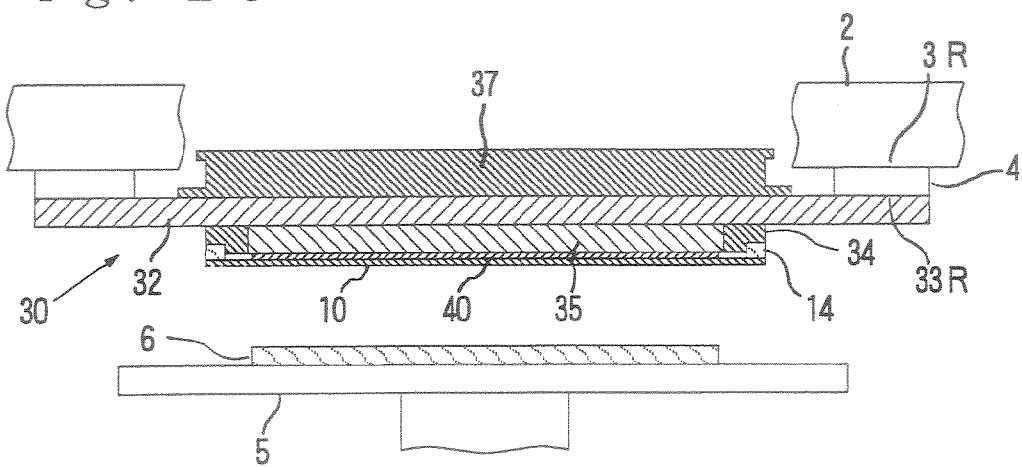
FIG. 28 is a cross-sectional view illustrating the construction of a first exemplary wafer inspection apparatus according to the present invention.
Figure 29:
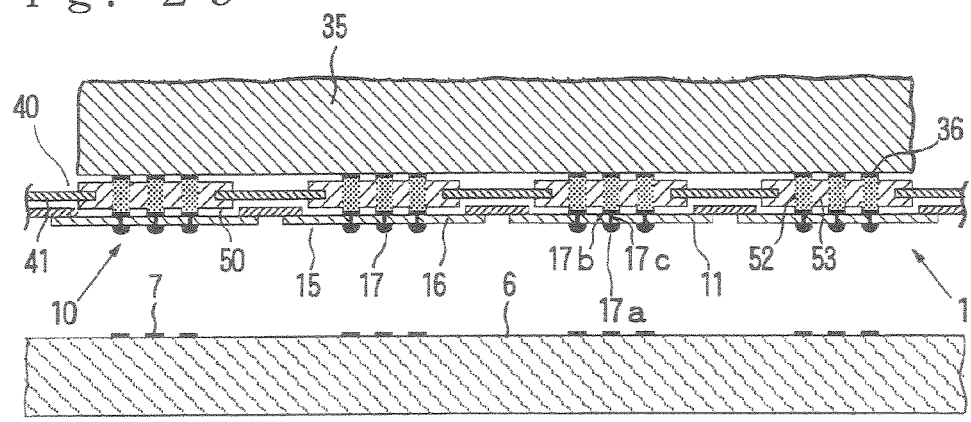
FIG. 29 is a cross-sectional view illustrating, on an enlarged scale, the construction of a principal part of the first exemplary wafer inspection apparatus.

FIG. 28 is a cross-sectional view schematically illustrating the construction of a wafer inspection apparatus according to a first embodiment of the present invention, and FIG. 29 is a cross-sectional view illustrating, on an enlarged scale, the construction of a principal part of the wafer inspection apparatus according to the first embodiment. This wafer inspection apparatus according to the first embodiment serves to collectively perform a burn-in nest on each of a plurality of integrated circuits formed on a wafer in a state of the wafer.

Figure 30:
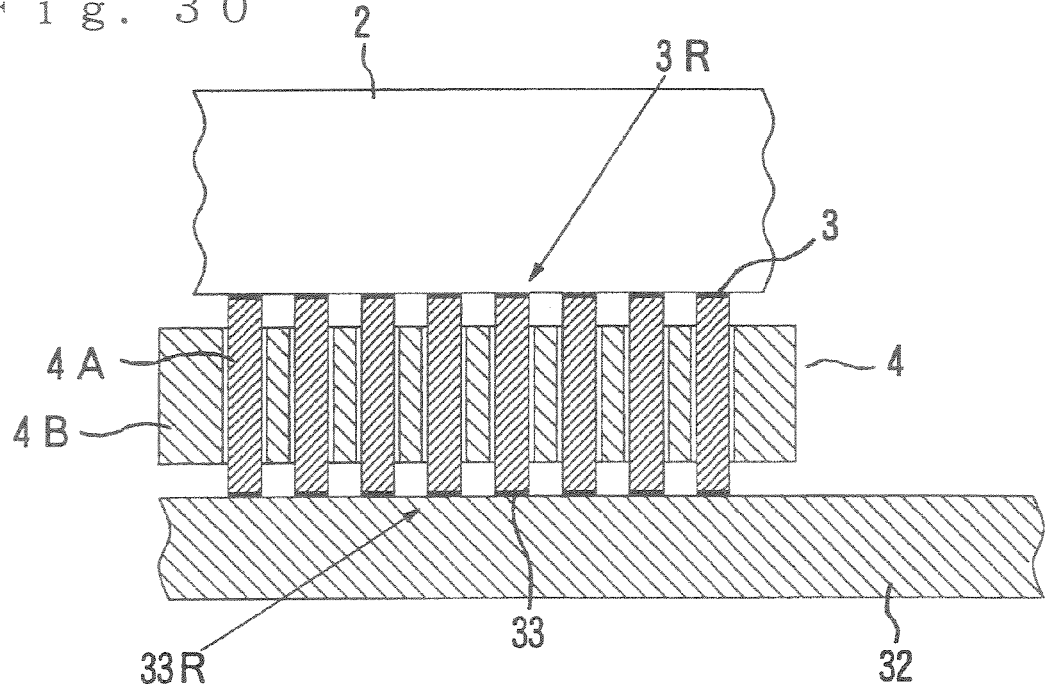
FIG. 30 is a cross-sectional view illustrating, on an enlarged scale, a connector in the first exemplary wafer inspection apparatus.

The wafer inspection apparatus according to the first embodiment has a controller 2 serving to make temperature control of a wafer 6, which is an object of inspection, supply an electric power for conducting the inspection of the wafer 6, make input-output control of signals and detect output signals from the wafer 6 to judge the quality of integrated circuits on the wafer 6. As illustrated in FIG. 30, the controller 2 has, on a lower surface thereof, an input-output terminal part 3R, in which a great number of input-output terminals 3 are arranged along a circumferential direction thereof.

The probe card 30 according to the first embodiment is arranged below the controller 2 in a state held by a proper holding means in such a manner that each of the lead electrodes 33 in the circuit board 31 for inspection of the probe card is opposed to its corresponding input-output terminal 3 of the controller 2.

As also illustrated on an enlarged scale in FIG. 30, a connector 4 is arranged between the input-output terminal part 3R of the controller 2 and the lead electrode part 33R of the circuit board 31 for inspection in the probe card 30, and each of the lead electrodes 33 of the circuit board 31 for inspection is electrically connected to its corresponding input-output terminal 3 of the controller 2 through the connector 4. The connector 4 in the illustrated embodiment is constructed by a plurality of conductive pins 4A capable of being elastically compressed in a lengthwise direction thereof and a supporting member 4B supporting these conductive pins 4A, and each of the conductive pins 4A is arranged so as to be located between the input-output terminal 3 of the controller 2 and the lead electrode 33 formed on the first base element 32.

A wafer mounting table 5, on which the wafer 6 that is the object of inspection is mounted, is provided below the probe card 30.

In such a wafer inspection apparatus, the wafer 6, which is the object of inspection, is mounted on the wafer mounting table 5, and the probe card 30 is then pressurized downward, whereby the respective front-surface electrode parts 17a in the electrode structures 17 of the sheet-like probe 10 thereof are brought into contact with their corresponding electrodes 7 to be inspected of the wafer 6, and moreover the respective electrodes 7 to be inspected of the wafer 6 are pressurized by the front-surface electrodes parts 17a. In this state, the conductive parts 52 for connection in the elastic anisotropically conductive films 50 of the anisotropically conductive connector 40 are respectively pinched by the inspection electrodes 36 of the circuit board 31 for inspection and the back-surface electrode parts 17b of the electrode structures 17 of the sheet-like probe 10 and compressed in the thickness-wise direction, whereby conductive paths are formed in the respective conductive parts 52 for connection in the thickness-wise direction thereof. As a result, electrical connection between the electrodes 7 to be inspected of the wafer 6 and the inspection electrodes 36 of the circuit board 31 for inspection is achieved. Thereafter, the wafer 6 is heated to a predetermined temperature through the wafer mounting table 5. In this state, necessary electrical inspection is performed on each of a plurality of integrated circuits in the wafer 6.

According to such a wafer inspection apparatus according to the first embodiment, electrical connection to the electrodes 7 to be inspected of the wafer 6, which is the object of inspection, is achieved through the probe card 30 according to the first embodiment. Accordingly, in a burn-in test, a good electrically connected state to the wafer 6 can be surely achieved even when the wafer 6 has a large area of 8 inches or greater in diameter, and the pitch of the electrodes 7 to be inspected is extremely small. In addition, positional deviation to the electrodes 7 to be inspected by temperature change can be surely prevented, whereby the good electrically connected state to the wafer 6 can be stably retained. Accordingly, in the burn-in test on the wafer, necessary electrical inspection can be surely performed on the wafer.

Figure 31:
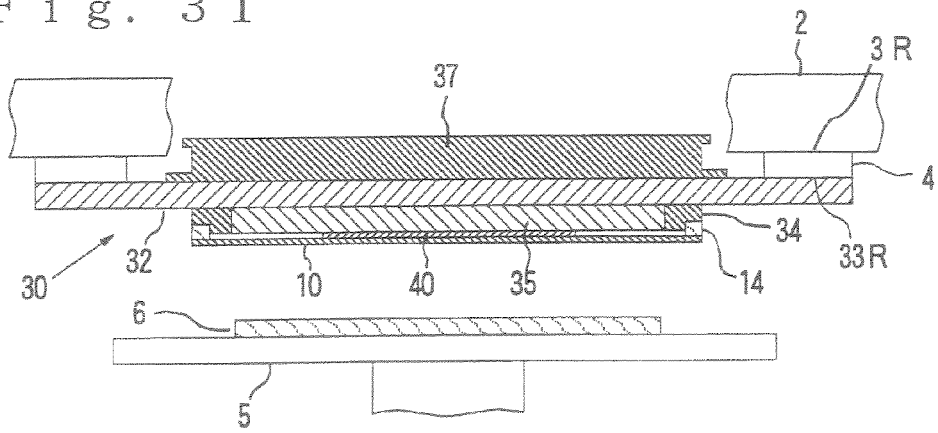
FIG. 31 is a cross-sectional view illustrating the construction of a second exemplary wafer inspection apparatus according to the present invention.
Figure 32:
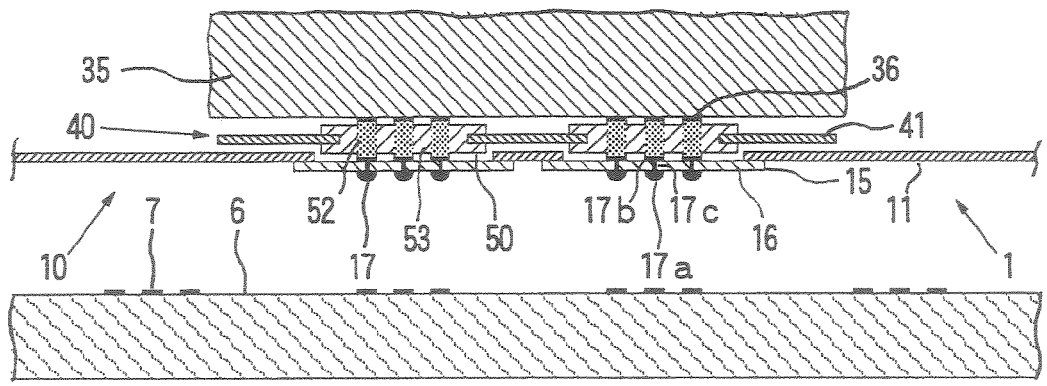
FIG. 32 is a cross-sectional view illustrating, on an enlarged scale, the construction of a principal part of the second exemplary wafer inspection apparatus.

FIG. 31 is a cross-sectional view schematically illustrating the construction of a wafer inspection apparatus according to a second embodiment of the present invention, and FIG. 32 is a cross-sectional view illustrating, on an enlarged scale, the construction of a principal part of the wafer inspection apparatus according to the second embodiment. This wafer inspection apparatus according to the second embodiment serves to perform a probe test on each of a plurality of integrated circuits formed on a wafer in a state of the wafer.

The wafer inspection apparatus according to the second embodiment has fundamentally the same construction as in the wafer inspection apparatus according to the first embodiment except that the probe card 30 according to the second embodiment is used in place of the probe card 30 according to the first embodiment.

In the wafer inspection apparatus according to the second embodiment, the probe card 30 is electrically connected to electrodes 7 to be inspected in, for example, 32 integrated circuits selected from among all integrated circuits formed on the wafer 6 to conduct inspection. Thereafter, the probe card 30 is electrically connected to electrodes to be inspected of a plurality of integrated circuits selected from among other integrated circuits to conduct inspection. These processes are repeated, whereby she probe rest on all the integrated circuits formed on the wafer is conducted.

According to such a wafer inspection apparatus according to the second embodiment, electrical connection to the electrodes 7 to be inspected of the wafer 6, which is the object, of inspection, is achieved through the probe card 30 according to the second embodiment. Accordingly, in a burn-in test, a good electrically connected state to the wafer 6 can be surely achieved even when the wafer 6 has a large area of 8 inches or greater in diameter, and the pitch of the electrodes 7 to be inspected is extremely small. In addition, positional deviation to the electrodes 7 to be inspected by temperature change can be surely prevented, whereby the good electrically connected state to the wafer 6 can be stably retained. Accordingly, in the probe test on the wafer, necessary electrical inspection can be surely performed on the wafer.

The present invention is not limited to the embodiments described above, and various changes or modifications can be added thereto as described below.

(1) The holding member 14 in the sheet-like probe 10 is not essential in the present invention.

(2) In addition to the conductive parts 52 for connection formed in accordance with the pattern corresponding to the pattern of the electrodes to be inspected, conductive parts for non-connection that are not electrically connected to any electrode to be inspected may be formed in the anisotropically conductive films 50 in the anisotropically conductive connector 40.

(3) The connector 4 for electrically connecting the controller 2 to the circuit board 31 for inspection in the wafer inspection apparatus is not limited to that illustrated in FIG. 30, and those having various structures may be used.

(4) The electrode structures 17 in the sheet-like probe 10 are not limited to those shown in FIG. 5, and those having various structures may be used.

Figure 33:
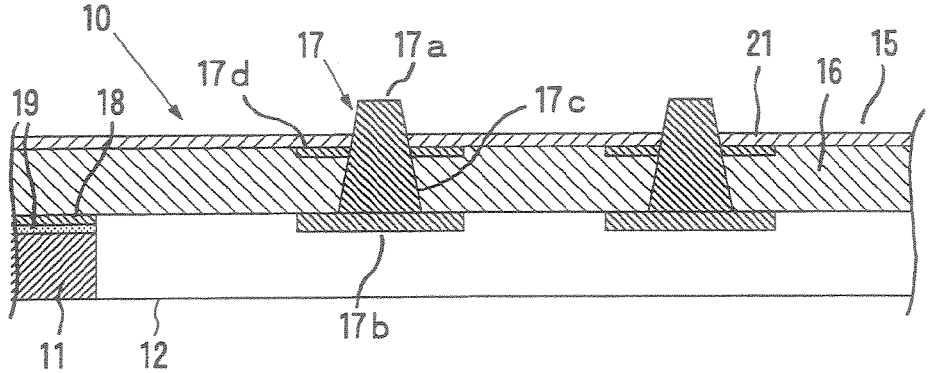
FIG. 33 is a cross-sectional view illustrating the construction of another exemplary sheet-like probe in the probe member according to the present invention.

FIG. 33 is a cross-sectional view illustrating the construction of a principal part of another exemplary sheet-like probe usable in the probe member according to the present invention.

Each of the electrode structures 17 in this sheet-like probe 10 is formed by a front-surface electrode part 17*a* in a truncated cone shape that the diameter becomes gradually small as it goes toward a proximal end from a distal end thereof, a flat plate-like back-surface electrode part 17*b*, a short circuit part 17*c* continuously extending from the proximal end of the front-surface electrode part 17*a* through in a thickness-wise direction of an insulating film 16 and linked to the back-surface electrode part 17*b*, and a holding part 17*d* continuously extending from a proximal end portion of the front-surface electrode part 17*a* outward along a plane direction of the insulating film 16. The holding part 17*d* in the electrode structure 17 is embedded in the insulating film 16 and in the illustrated embodiment, is arranged in such a manner that the surface of the holding part 17*d* is located on the same plane as the surface of the insulating film 16. In the sheet-like probe 10 of this embodiment, an insulating protecting layer 21 is provided so as to cover the surface of the insulating film 16 and the surfaces of the holding parts 17*d* of the electrode structures 17, and the front-surface electrode parts 17*a* of the electrode structures 17 are in a state projected from the surface of the insulating protecting layer 21. Other constructions in this sheet-like probe 10 are fundamentally the same as those in the sheet-like probe 10 illustrated in FIG. 5.

A material for forming the insulating protecting layer 21 is suitably selected for use from those exemplified as the materials for forming the insulating film 16. However, a material capable of being etched is preferred, with polyimide being particularly preferred.

The sheet-like probe 10 of such construction can be produced, for example, in the following manner.

Figure 34:
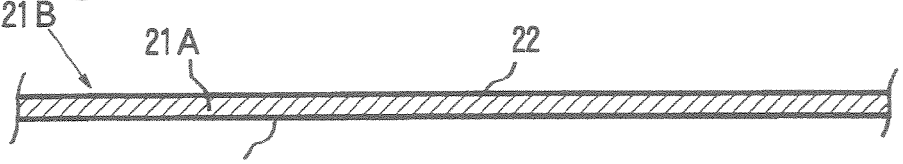
FIG. 34 is a cross-sectional view illustrating the construction of a laminate material used for producing the sheet-like probe shown in FIG. 33.

As illustrated in FIG. 34, a laminate material 21B composed of a resin sheet 21A for insulating protecting layers, a metal foil 22 for plating electrode integrally provided on a front surface of the resin sheet 21A for insulating protecting layers, and a metal foil 23 for forming holding parts integrally provided on a back surface of the resin sheet 21A for insulating protecting layers is provided. With respect to the resin sheet 21A for insulating protecting layers, the total of the thickness thereof and the thickness of the metal foil 23 for forming holding parts is set so as to equal to the projected height of each of front-surface electrode parts 17*a* to be formed, while the thickness of the metal foil 23 for forming holding part is set so as to equal to the thickness of each of holding parts 17*d* to be formed.

Figure 35:
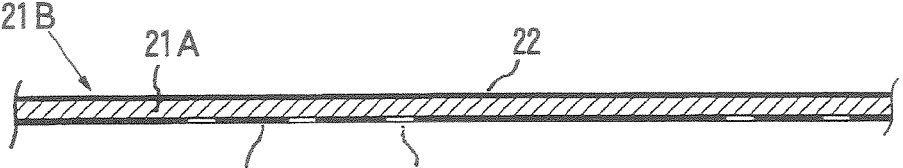
FIG. 35 is a cross-sectional view illustrating a state that openings have been formed in a metal foil for foaming holding parts of the laminate material.
Figure 36:
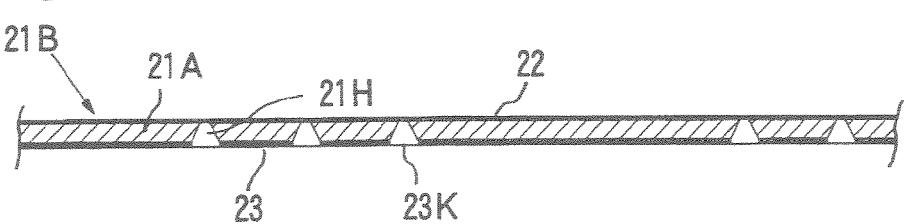
FIG. 36 is a cross-sectional view illustrating a state that through-holes have been formed in a resin sheet for insulating protecting layers of the laminate material.
Figure 37:
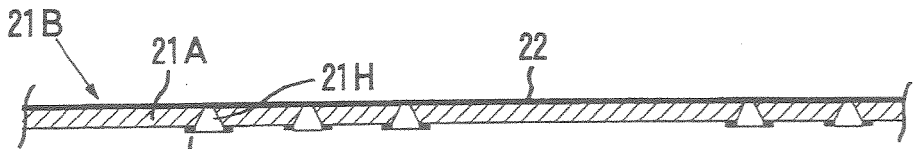
FIG. 37 is a cross-sectional view illustrating a state that holding parts have been formed on a back surface of the resin sheet for insulating protecting layers of the laminate material.

The metal foil 23 for forming holding parts in the laminate material 21B is then subjected to photolithography and an etching treatment, whereby a plurality of openings 23K are formed in the metal foil 23 for forming holding parts in accordance with a pattern corresponding to a pattern of electrode structures 17 to be formed as illustrated in FIG. 35. Thereafter, the resin sheet 21A for insulating protecting layers is subjected to an etching treatment at portions exposed through the openings 23K in the metal foil 23 for forming holding parts, thereby forming, in the resin sheet 21A for insulating protecting layers, a plurality of tapered, through-holes 21H, the diameter of which becomes gradually small from the back surface of the resin sheet 21A for insulating protecting layers toward the front surface thereof, and which are linked to the respective openings 23K of the metal foil 23 for forming holding parts as illustrated in FIG. 36. The metal foil 23 for forming holding parts is then subjected to photolithography and an etching treatment, whereby holding parts 17*d* are formed around the respective through-holes 21H in the back surface of the resin sheet 21A for insulating protecting layers as illustrated in FIG. 37.

Figure 38:
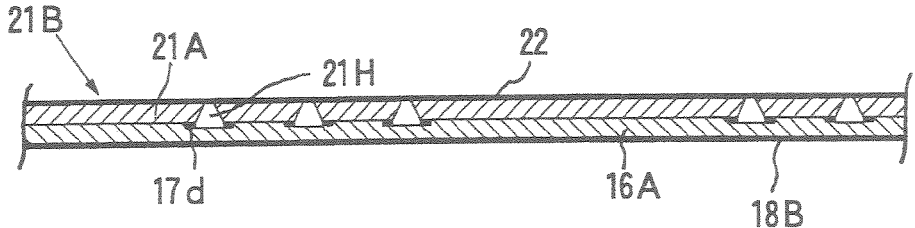
FIG. 38 is a cross-sectional view illustrating a state that a resin sheet for insulating films and a metal foil for forming back-surface electrode parts have been laminated on the back surface of the resin sheet for insulating protecting layers of the laminate material.
Figure 39:
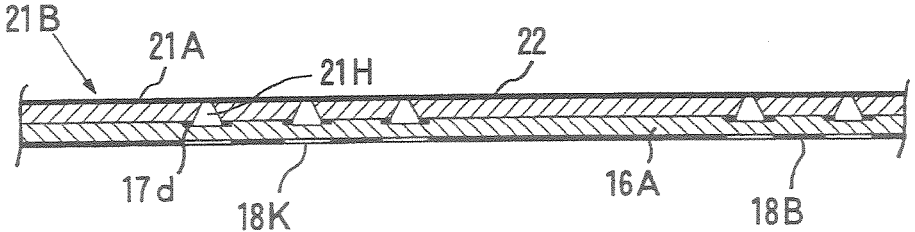
FIG. 39 is a cross-sectional view illustrating a state that openings have been formed in the metal foil for forming back-surface electrode parts.
Figure 40:
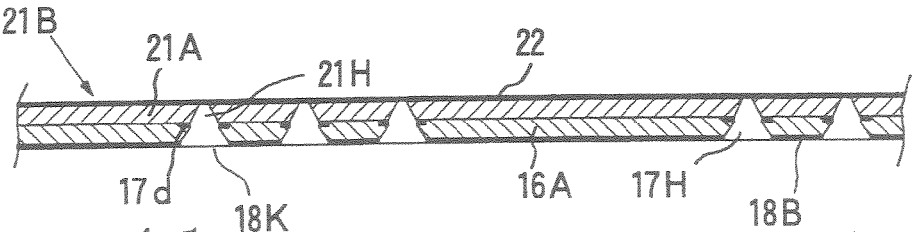
FIG. 40 is a cross-sectional view illustrating a state than through-holes have been formed in the resin sheet for insulating films.

As illustrated in FIG. 38, a resin sheet 16A for insulating films is then integrally laminated on the back surface of the resin sheet 21A for insulating protecting layers, and a metal foil 18B for forming back-surface electrode parts is integrally laminated on the back surface of the resin sheet 16A for insulating films. The metal foil 18B for forming back-surface electrode parts is then subjected to photolithography and an etching treatment, whereby a plurality of openings 18K are formed in the metal foil 18B for forming back-surface electrode parts in accordance with a pattern corresponding no a pattern of back-surface electrode parts 17b of electrode structures 17 to be formed as illustrated in FIG. 39. Thereafter, the resin sheet 16A for insulating films is subjected to an etching treatment at portions exposed through the openings 18K in the metal foil 18B for forming back-surface electrode parts, thereby forming, in the resin sheet 16A for insulating films, a plurality of tapered through-holes 17H, the diameter of which becomes gradually small from the back surface of the resin sheet 16A for insulating films toward the front surface thereof, and which are linked to the respective openings 18K of the metal foil 18B for forming back-surface electrode parts and the through-holes 21H of the resin sheet 21A for insulating protecting layers as illustrated in FIG. 40.

In the above-described process, etchants for etching the metal foil 23 forming holding parts and the metal foil 18B for forming back-surface electrode parts are suitably selected according to materials forming the metal foils. When these metal foils are composed of, for example, copper, an aqueous solution of ferric chloride may be used.

As etchants for etching the resin sheet 21A for insulating protecting layers and the resin sheet 16A for insulating films, may be used amine etchants, aqueous hydrazine solutions and aqueous solutions of potassium hydroxide. Conditions for the etching treatments are selected, whereby the tapered through-holes, the diameter of which becomes gradually small from the back surface toward the front surface, can be formed in the resin sheet 21A for insulating protecting layers and the resin sheet 16A for insulating films, respectively.

Figure 41:
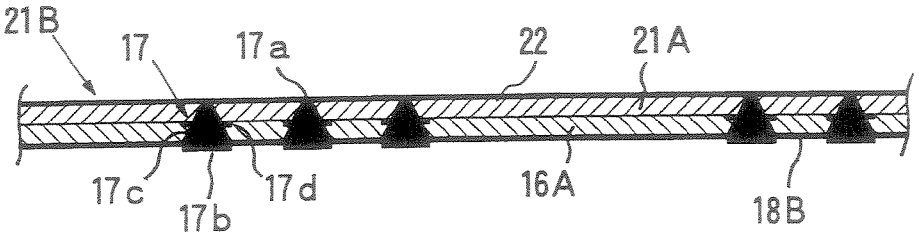
FIG. 41 is a cross-sectional view illustrating a state that electrode structures have been formed in the laminate material.
Figure 42:
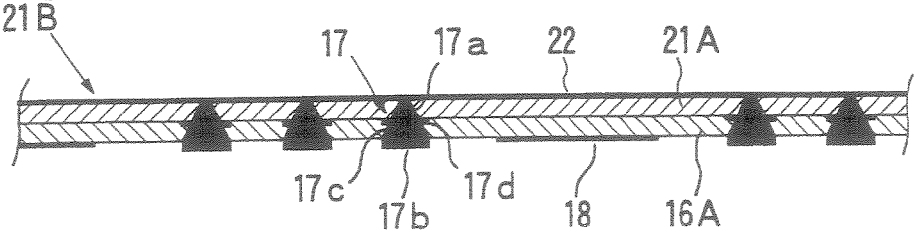
FIG. 42 is a cross-sectional view illustrating a state that a metal film has been formed on a back surface of the resin sheet for insulating films.
Figure 43:
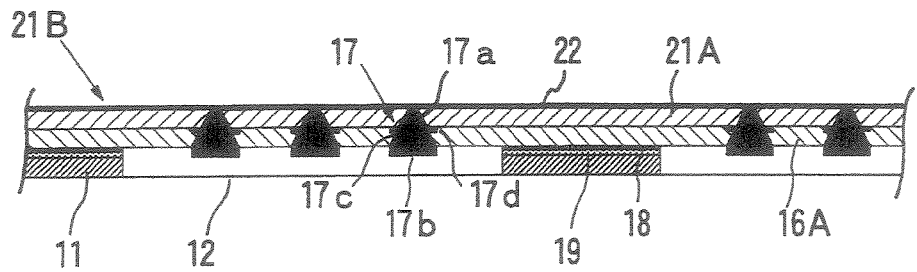
FIG. 43 is a cross-sectional view illustrating a state that a frame plate has been bonded to the metal film through an adhesive layer.

The laminate material 21B is then subjected to an electroplating treatment by using the metal foil 22 for plating electrode as an electrode to fill a metal into the respective through-holes 21K of the resin sheet 21A for insulating protecting layers and the respective through-holes 17H of the resin sheet 16A for insulating films, thereby forming front-surface electrode parts 17a, short circuit parts 17c and back-surface electrode parts 17b as illustrated in FIG. 41, thus forming electrode structures 17. Here, the respective back-surface electrode parts 17b are in a state connected to one another through the metal foil 18B for forming back-surface electrode parts. Thereafter, the metal foil 18B for forming back-surface electrode parts is subjected to photolithography and an etching treatment, thereby forming back-surface electrode parts 17b separated from one another and metal films 18 having a necessary form as illustrated in FIG. 42. A frame plate 11 is bonded to the metal films 18 through adhesive layers 19 as illustrated in FIG. 43.

Figure 44:
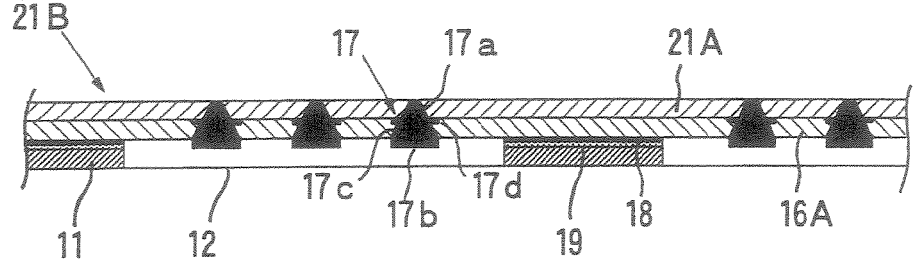
FIG. 44 is a cross-sectional view illustrating a state that a metal foil for plating electrode has been removed from the laminate material.
Figure 45:
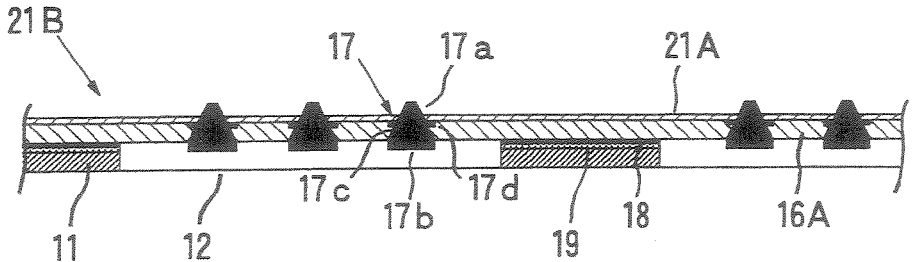
FIG. 45 is a cross-sectional view illustrating a state that front-surface electrode parts of the electrode structures have been projected from, the surface of the insulating protecting layer.

The metal foil 22 for plating electrode is then subjected to an etching treatment to remove it, thereby exposing the surface of the resin sheet 21A for insulating protecting layers as illustrated in FIG. 44, and the resin sheet 21A for insulating protecting layers is subjected to an etching treatment to reduce the thickness thereof, thereby creating a state that the front-surface electrode parts 17a of the respective electrode structures 17 have been projected from the surface of the resin sheet 21A for insulating protecting layers as illustrated in FIG. 45.

Figure 46:
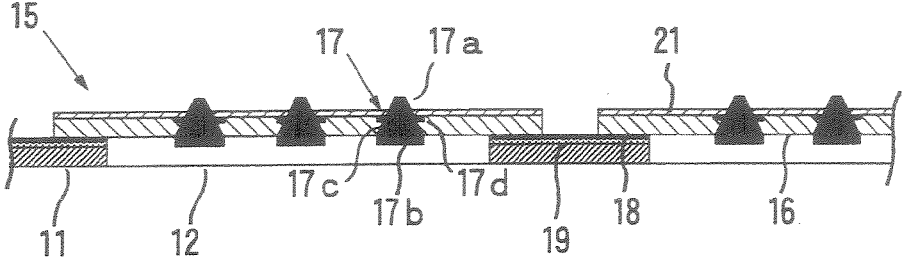
FIG. 46 is a cross-sectional view illustrating a state that insulating films and insulating protecting layers have been formed.

Thereafter, the resin sheet 21A for insulating protecting layers and the resin sheet 16A for insulating films are subjected to an etching treatment, thereby forming a plurality of insulating protecting layers 21 and insulating films 16, which are independent of one another, as illustrated in FIG. 46, thereby forming a plurality of contact films 15. A holding member (not illustrated) is arranged and fixed to a peripheral edge portion on the back surface of the frame plate 11, thereby obtaining a sheet-like probe.

Figure 47:
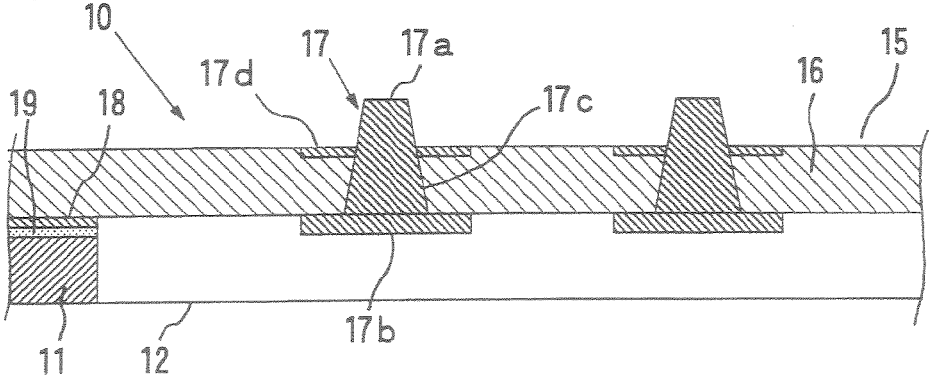
FIG. 47 is a cross-sectional view illustrating the construction of a modified example of the sheet-like probe shown in FIG. 33.

In the sheet-like probe 10 described above, the insulating protecting layer 21 are not essential, and the sheet-like probe may be so constructed that the surfaces of the insulating films 16 and the surfaces of the holding parts 17d in the electrode structures 17 are exposed as illustrated in FIG. 47.

Figure 48:
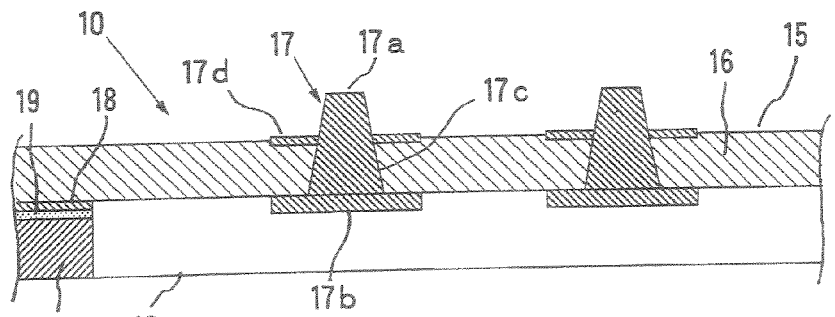
FIG. 48 is a cross-sectional view illustrating the construction of another modified example of the sheet-like probe shown in FIG. 33.

As illustrated in FIG. 48, the holding parts 17d in the electrode structures 17 may be provided in a state that part thereof are embedded in the respective insulating films 16 and projected from the surfaces of the insulating films 16.

Figure 49:
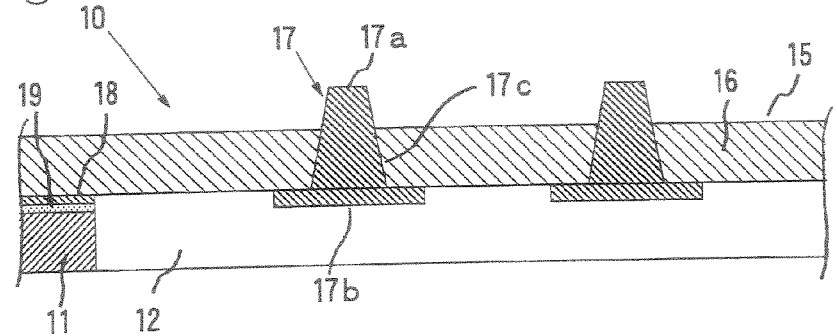
FIG. 49 is across-sectional view illustrating the construction of a further modified example of the sheet-like probe shown in FIG. 33.

As Illustrated in FIG. 49, the electrode structures 17 may also be so constructed that no holding part is provided.

Figure 50:
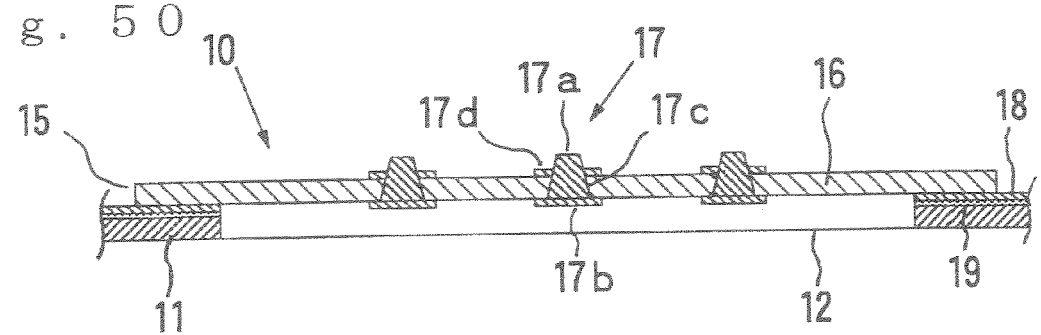
FIG. 50 is a cross-sectional view illustrating the construction of a still further modified example of the sheet-like probe shown in FIG. 33.

As illustrated in FIG. 50, the holding parts 17d in the electrode structures 17 may also be provided on the surfaces of the respective insulating films.

Figure 51:
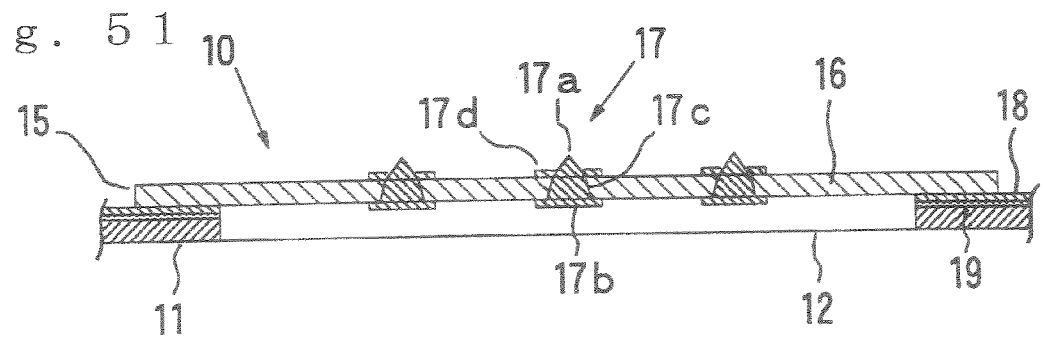
FIG. 51 is a cross-sectional view illustrating the construction of a yet still further modified example of the sheet-like probe shown in FIG. 33.
Figure 52:
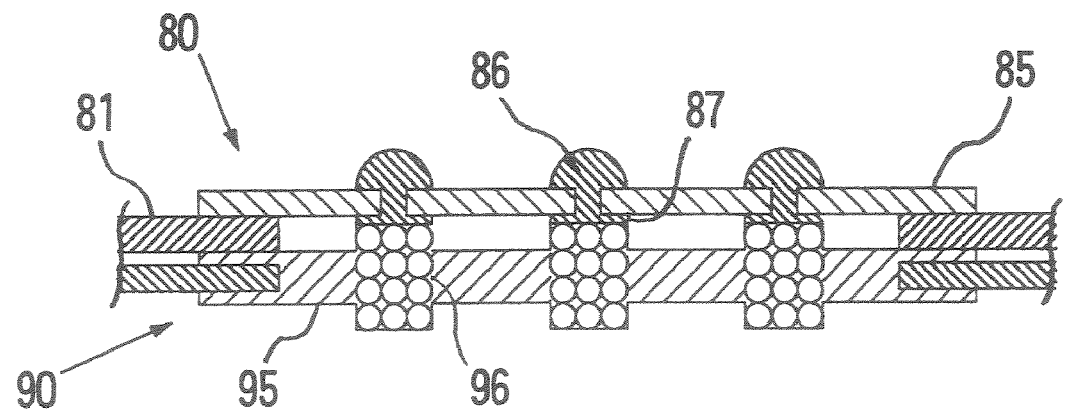
FIG. 52 is a cross-sectional view illustrating a positional relation between a sheet-like probe and an anisotropically conductive connector in a conventional probe card.

As illustrated in FIG. 51, each of the electrode structures 17 in the sheet-like probe 10 may be formed of a front-surface electrode part 17a in a conical shape that the diameter becomes gradually small as it goes toward a proximal end from a distal end thereof, a back-surface electrode part 17b, a short circuit part 17c continuously extending from the proximal end of the front-surface electrode part 17a through in a thickness-wise direction of an insulating film 16 and linked to the back-surface electrode part 17b, and a holding part 17d continuously extending from a proximal end portion of the front-surface electrode part 17a outward along the surface of the insulating film 16.

EXAMPLES

The present invention will hereinafter be described specifically by the following Examples. However, the present invention is not limited to these Examples.

[Production of Wafer for Test]

On a wafer made of silicon and having a diameter of 8 inches, were formed 393 square integrated circuits L in total, which each had dimensions of 8 mm×8 mm. Each of the integrated circuits L formed on the wafer has a region of electrodes to be inspected at its center. In the region of the electrodes to be inspected, 40 rectangular electrodes 7 to be inspected each having dimensions of 200 μm in a vertical direction and 70 μm in a lateral direction are arranged at a pitch of 120 μm in a row in a lateral direction. The total number of the electrodes 7 to be inspected in the whole wafer is 15,720. All the electrodes 7 to be inspected are electrically insulated from one another. This wafer will hereinafter be referred to as "Wafer W1 for test".

Further, 393 integrated circuits, which had the same construction as in the Wafer W1 for test except that two electrodes among 40 electrodes to be inspected in each integrated circuit were electrically connected to each other every second electrode counting from an endmost electrode to be inspected in place of the fact that all the electrodes 7 to be inspected were electrically insulated from one another, were formed on a wafer. This wafer will hereinafter be referred to as "Wafer W2 for test".

Example 1

[Production of Sheet-Like Probe]

A frame plate (11) of the following specification was produced in accordance with the construction shown in FIG. 6.

This frame plate (11) has a circular form having a diameter of 22 cm and a thickness of 25 μm, and 393 openings (12) corresponding to the regions of the electrodes to be inspected of the integrated circuits in Wafer W1 for test. Each of the openings (12) has dimensions of 6.4 mm×1.6 mm.

A laminate material (21B) obtained by integrally laminating a metal foil (22) for plating electrode and a metal foil (23) for forming holding parts, which each had a diameter of 20 cm and a thickness of 4 μm and were composed of copper, on both surfaces of a resin sheet (21A) for insulating protecting layers, which had a diameter of 20 cm and a thickness of 25 μm and was composed of polyimide, is provided (see FIG. 34).

A protecting film is formed on the whole front surface of the metal foil (22) for plating electrode by a protecting seal having a thickness of 25 μm and composed of polyethylene terephthalate, and a resist film, in which 15,720 circular patterned holes each having a diameter of 55 μm were formed in accordance with a pattern corresponding to the pattern of the electrodes to be inspected formed on Wafer W1 for test, was formed on the whole back surface of the metal foil (23) for forming holding parts. In the formation of the resist film, an exposure treatment was conducted by irradiation of ultraviolet light of 80 mJ by a high pressure mercury lamp, and a development treatment was conducted by repeating a process of immersing the laminate material for 40 seconds in a developer composed of a 1% agueous solution of sodium hydroxide twice.

The metal foil (23) for forming holding parts was then subjected to an etching treatment with a ferric chloride etchant under conditions of 50° C. for 30 seconds, thereby forming, in the metal foil (23) for forming holding parts, 15,720 openings (23K) linked to the respective patterned holes in the resist film (see FIG. 35).

Thereafter, the resin sheet (21A) for insulating protecting films was subjected to an etching treatment with an amine type polyimide etchant (product of Toray Engineering Co., Ltd., "TPE-3000") under conditions of 80° C. for 10 minutes, thereby forming, in the resin sheet (21A) for insulating protecting films, 15,720 through-holes (21H) linked to the respective openings (23K) in the metal foil (23) for forming holding parts (see FIG. 36).

Each of the through-holes (21E) was in a tapered form that the diameter becomes gradually small from the back surface of the resin sheet (21A) for insulating protecting films toward the front surface thereof, and had an opening diameter of 55 μm on the back surface side and an opening diameter of 20 μm (in terms of an average value) on the front surface side.

The laminate material (21B) was then immersed for 2 minutes in a sodium hydroxide solution at 45° C., thereby removing the resist film from the laminate material (21B). Thereafter, a resist pattern was formed, on the laminate material (21B) with a dry film resist (product of Hitachi Chemical Co., Ltd.; Photec RY-3210) having a thickness of 10 lira so as to cover the through-holes (23H) in the metal foil (23) for forming holding parts and surroundings thereof, and the metal foil (23) for forming holding parts was subjected to an etching treatment with a ferric chloride etchant under conditions of 50° C. for 30 seconds, thereby forming holding parts (17d) at the surroundings of the through-holes (23H) in the metal foil (23) for forming holding parts (see FIG. 37). In the formation of the resist pattern, an exposure treatment was conducted by irradiation of ultraviolet light of 80 mJ by a high pressure mercury lamp, and a development treatment was conducted by repeating a process of immersing the laminate material for 40 seconds in a developer composed of a 1% aqueous solution or sodium hydroxide twice. The laminate material (21B) was then immersed for 2 minutes in a sodium hydroxide solution at 45° C., thereby removing the resist pattern from the laminate material (21B).

A thermoplastic polyimide sheet (product of Nippon Steel Chemical Co., Ltd.; trade name "ESPANEX") having a diameter of 20.4 cm and a thickness of 25 μm was then stacked as a resin sheet (16A) for insulating films on the resin sheet (21A) for insulating protecting layer in the laminate (21B), a metal foil (18B) for forming back-surface electrode parts, which had a diameter of 22 cm and a thickness of 25 μm and was composed of 42 alloy, was stacked on this resin sheet (16A) for insulating films, and a hot-pressing treatment was conducted under conditions of 165° C., 40 kgf/cm² and 1 hour, thereby integrating the resin sheet (21A) for insulating protecting layer, the resin sheet (16A) for insulating films and the metal foil (18B) for forming back-surface electrode parts (see FIG. 38).

A resist film, in which 15,720 circular patterned holes each having a diameter of 60 μm were formed in accordance with a pattern corresponding to the pattern of the electrodes to be inspected formed on Wafer W1 for test, was then formed on the front surface of the metal foil (18B) for forming back-surface electrode parts.

The metal foil (18B) for forming back-surface electrode parts was then subjected to an etching treatment with a ferric chloride enchant under conditions of 50° C. for 30 seconds, thereby forming, in the metal foil (18B) for forming back-surface electrode parts, 15,720 openings (18K) linked to the patterned holes in the resist film (see FIG. 39).

Thereafter, the resin sheet (16A) for insulating films was subjected to an etching treatment with an amine type polyimide etchant (product of Toray Engineering Co., Ltd., "TPE-3000") under conditions of 80° C. for 10 minutes, thereby forming, in the resin sheet (16A) for insulating films, 15,720 through-holes (17H) linked to the respective openings (18H) in the metal foil (18B) for forming back-surface electrode parts and through-holes (21H) in the resin sheet (21A) for insulating protecting layer (see FIG. 40).

Each of the through-holes (17H) was in a tapered form that the diameter becomes gradually small from the back surface of the resin sheet (16A) for insulating films toward the front surface thereof, and had an opening diameter of 60 μm on the back surface side and an opening diameter of 40 μm (in terms of an average value) on the front surface side.

The resist film was removed from the metal foil (18B) for forming back-surface electrode parts, and a resist film having 15,720 patterned holes each having dimensions of 60 μm×150 μm and linked to the respective opening (18H) in the metal foil (18B) for forming back-surface electrode parts was newly formed on the surface of the metal foil (18B) for forming back-surface electrode parts.

The laminate material (21B) was then immersed in a plating bath containing nickel sulfamate to subject the laminate material (21B) to an electroplating treatment by using the metal foil (22) for plating electrode as an electrode to fill a metal into the through-holes (21H) in the resin sheet (21A) for insulating protecting layers, the through-holes (17H) in the resin sheet (16A) for insulating films and one patterned holes in the resist film, thereby forming front-surface electrode parts (17a), short circuit parts (17c) and back-surface electrode pares (17b), thus forming electrode structures (17) (see FIG. 41).

Thereafter, the laminate material (21B) was immersed for 2 minutes in a sodium hydroxide solution at 45° C., thereby removing the resist film from the metal foil (18B) for forming back-surface electrode parts, and a patterned resist film for etching was newly formed on the metal foil (18B) for forming back-surface electrode parts.

The metal foil (18B) for forming back-surface electrode parts was then subjected to an etching treatment with a ferric chloride etchant under conditions of 50° C. for 30 seconds, thereby separating the respective electrode structures (17) from one another, and forming metal films (18) having a necessary form on the resin sheet (16A) for insulating films (see FIG. 42). Thereafter, the resist film was removed from the metal foil (22) for plating electrode and the metal films (18), and the frame plate (11) was bonded to the metal films (18) through adhesive layers (19) (see FIG. 43).

The frame plate (11), the resin sheet (16A) for insulating films and the back-surface electrode parts (17b) of the electrode structures (17) were covered with a resist film, the protecting film was released from the surface of the metal foil (22) for plating electrode, and the metal foil (22) for plating electrode was subjected to an etching treatment with a ferric chloride etchant under conditions of 50° C. for 30 seconds, thereby removing the metal foil (22) for plating electrode (see FIG. 44).

Thereafter, the resin sheet (21A) for insulating protecting films was subjected to an etching treatment with an amine type polyimide etchant (product of Toray Engineering Co., Ltd., "TPE-3000") under conditions of 80° C. for 6 minutes to reduce the thickness of the resin sheet (21A) for insulating protecting films from 25 μm to 5 μm, thereby creating a state that the front-surface electrode parts (17a) of the respective electrode structures (17) had been projected from the surface of the resin sheet (21A) for insulating protecting layers (see FIG. 45). The resist film was removed from the frame plate (11), the resin sheet (16A) for insulating films and the back-surface electrode parts (17b) of the electrode structures (17) by immersing for 2 minutes in a sodium hydroxide solution at 45° C.

A patterned resist film was formed on the front-surface electrode parts (17a) of the electrode structures (17) and the surface of the resin sheet (21A) for insulating protecting films with a dry film resist having a thickness of 25 μm. Thereafter, the resin sheet 21A for insulating protecting layers and the resin sheet (16A) for insulating films were subjected to an etching treatment with an amine type polyimide etchant (product of Toray Engineering Co., Ltd., "TPE-3000") under conditions of 80° C. for 10 minutes, thereby forming a plurality of insulating protecting layers (21) and insulating films (16), which were separated from one another, thus forming a contact film (15) in each of the openings (12) of the frame plate (11) (see FIG. 46). Thereafter, the laminate material and the frame plate were immersed for 2 minutes in an aqueous solution of sodium hydroxide at 45° C., thereby removing the resist film from the front-surface electrode parts (17a) and the insulating protecting layers (21).

A silicone type thermosetting adhesive (product of Shin-Etsu Chemical Co., Ltd.; trade name: 1300T) was applied to a peripheral edge portion of the frame plate (11), and a ring-like holding member having an outer diameter of 220 mm, an inner diameter of 205 mm and a thickness of 2 mm and composed of silicon nitride was arranged on the portion, to which the silicone type thermosetting adhesive had been applied, in a state held at 150° C. Further, the frame plate (11) and the holding member were held at 180° C. for 2 hours while pressurizing them, thereby bonding the holding member to the frame plate (11), thus producing a sheet-like probe.

The specification of the sheen-like probe thus obtained is as follows.

The frame plate is in the form of a disk having a diameter of 22 cm and a thickness of 25 μm, and a material thereof is 42 alloy. The number of openings in the frame plate is 393, and the openings each have dimensions of 6.4 mm in a lateral direction and 1.6 mm in a vertical direction.

The material of the insulating film and insulating protecting layer in the contact film is polyimide, and dimensions in vertical and lateral directions are 7.5 mm×7.5 mm, and the thickness of the insulating film is 25 μm, and the thickness of the insulating protecting layers is 5 μm.

The number of electrode structures in each contact film is 40 (15,720 in total), and the electrode structures are arranged at a pitch of 120 μm so as to align in a row in a lateral direction.

The front-surface electrode part in each of the electrode structures is in the form of a truncated cone, the diameter of the distal end portion is 20 μm, and the diameter of the proximal end portion is 55 μm. The back-surface electrode part is in the form of a rectangular plate having dimensions of 60 μm×150 μm, and the thickness thereof is 14 μm. The short circuit part is in the form of a truncated cone, the diameter on the front surface side is 40 μm, and the diameter on the back surface side is 60 μm. The holding part is in she form of a circular ring having an outer diameter of 80 μm.

A gap d between the level of the back surface of the frame plate in the sheet-like probe and the level of the electrode surface of the back-surface electrode part is 15 μm.

[Production of Anisotropically Conductive Connector]

(1) Preparation of Magnetic Core Particles:

Commercially available nickel particles (product of Westaim Co., "FC1000") were used to prepare magnetic core particles in the following manner.

An air classifier "Turboclassifier TC-15N" manufactured by Nisshin Engineering Co., Ltd. was used to subject 2 kg of the nickel particles to a classification treatment under conditions of a specific gravity of 8.9, an air flow of 2.5 m$^3$/min, a rotor speed of 2,250 rpm, a classification point of 15 μm and a feed rate of the nickel particles of 60 g/min, thereby collecting 0.8 kg of nickel particles having a particle diameter of at most 15 μm, and 0.8 kg of the nickel particles were subjected to another classification treatment under conditions of a specific gravity of 8.9, an air flow of 2.5 m$^3$/min, a rotor speed of 2,930 rpm, a classification point of 10 μm and a feed rate of the nickel particles of 30 g/min to collect 0.5 kg of nickel particles.

The nickel particles thus obtained had a number average particle diameter of 7.4 μm, a coefficient of variation of particle diameter of 27%, a BET specific surface area of 0.46× 10$^3$ m$^2$/kg and a saturation magnetization of 0.6 Wb/m$^2$.

The nickel particles are referred to as "Magnetic Core Particles [A]", (2) Preparation of Conductive Particles:

Into a treating vessel of a powder plating apparatus, were poured 100 g of Magnetic Core Particles [A], and 2 L of 0.32N hydrochloric acid was further added. The resultant mixture was stirred to obtain a slurry containing Magnetic Core Particles [A]. This slurry was stirred at ordinary temperature for 30 minutes, thereby conducting an acid treatment for Magnetic Core Particles [A]. Thereafter, the slurry thus treated was left at rest for 1 minute to precipitate Magnetic Core Particles [A], and a supernatant was removed.

To the Magnetic Core Particles [A] subjected to the acid treatment, was added 2 L of purified water, and the mixture was stirred an ordinary temperature for 2 minutes. The mixture was then left at rest for 1 minute to precipitate Magnetic Core Particles [A], and a supernatant was removed. This process was conducted repeatedly additionally twice, thereby conducting a washing treatment for Magnetic Core Particles [A].

To the Magnetic Core Particles [A] subjected to the acid treatment and washing treatment, was added 2 L of a gold plating solution containing gold in a proportion of 20 g/L. The temperature of the treating vessel was raised to 90° C. and the contents were stirred, thereby preparing a slurry. While stirring the slurry in this state, Magnetic Core Particles [A] were subjected to displacement plating with gold. Thereafter, the slurry was left at rest while allowing it to cool, thereby precipitating particles, and a supernatant was removed, thereby preparing conductive particles.

To the conductive particles obtained in such a manner, was added 2 L of purified water, and the mixture was stirred at ordinary temperature for 2 minutes. Thereafter, the mixture was left at rest for 1 minute to precipitate the conductive particles, and a supernatant was removed.

This process was conducted repeatedly additionally twice, 2 L of purified water heated to 90° C. was then added to the particles, and the mixture was stirred. The resultant slurry was filtered through filter paper to collect conductive particles. The conductive particles thus obtained were dried in a dryer set to 90° C.

The resultant conductive particles had a number average particle diameter of 7.3 μm and a BET specific surface area of $0.38 \times 10^3$ m$^2$/kg, and a value of (mass of gold forming a coating layer)/(mass of Magnetic Core Particles [A]) was 0.3.

The conductive particles are referred to as "Conductive Particles (a)".

(3) Production of Frame Plate:

A frame plate (41) having 393 openings (42) formed corresponding to the respective regions of the electrodes to be inspected in Wafer W1 for test was produced under one following conditions in accordance with the construction shown in FIG. 16.

A material of this frame plate (41) is covar (coefficient of linear thermal expansion: $5 \times 10^{-6}$/K), the diameter thereof is 8 inches, and the thickness thereof is 60 μm. The openings (42) each have dimensions of 5,400 μm in a lateral direction and 320 μm in a vertical direction.

A circular air inflow hole is formed at a central position between openings (42) adjoining in the vertical direction, and the diameter thereof is 1,000 μm.

(4) Preparation of Molding Material.

To 100 parts by weight of addition type liquid silicone rubber, were added 30 parts by weight of Conductive Particles [a] to mix them. Thereafter, the resultant mixture was subjected to a defoaming treatment by pressure reduction, thereby preparing a molding material.

In the above-described process, the addition type liquid silicone rubber used is of a two-pack type composed of Liquid A and Liquid B each having a viscosity of 250 Pa·s. The cured product thereof has a compression set of 5%, a durometer A hardness of 32 and tear strength of 25 kN/m.

Incidentally, the properties of the addition type liquid silicone rubber and the cured product thereof were measured in the following manner.

(a) The viscosity of the addition type liquid silicone rubber was a value measured by means of a Brookfield type viscometer at 23±2° C.

(b) The compression set of the cured product of the silicone rubber was measured in the following manner.

Liquid A and Liquid B in the two-pack type liquid silicone rubber were stirred and mixed in proportions that their amounts become equal. After this mixture was then poured into a mold, and subjected to a defoaming treatment by pressure reduction, it was subjected to a curing treatment under conditions of 120° C. for 30 minutes, thereby forming a columnar body composed of a cured product of the silicone rubber and having a thickness of 12.7 mm and a diameter of 29 mm. This columnar body was post-cured under conditions of 200° C. for 4 hours.

The columnar body obtained in such a manner was used as a specimen to measure a compression set at 150±2° C. in accordance with JIS K 6249.

(c) The tear strength of the cured product of the silicone rubber was measured in the following manner.

A curing treatment and post-curing of addition type liquid silicone rubber were conducted under the same conditions as in the item (b), thereby producing a sheet having a thickness of 2.5 mm. A crescent type specimen was prepared by punching from this sheet to measure its tear strength at 23±2° C. in accordance with JIS K 6249.

(d) The durometer A hardness was determined by using, as a specimen, a laminate obtained by stacking 5 sheets produced in the same manner as in the item (c) on one another, and measuring a value at 23±2° C. in accordance with JIS K 6249.

The frame plate produced in the item (3) and the molding material prepared in the item (4) were used to form 393 elastic anisotropically conductive films, which were arranged in the respective openings in the frame plate and respectively fixed to and supported by opening edges of the openings, in accordance with the process described in Japanese Patent. Application Laid-Open No. 2002-324600, thereby producing an anisotropically conductive connector.

In the above-described process, the curing treatment of the molding material layers was conducted under conditions of 100° C. for 1 hour while applying a magnetic field of 2 T in a thickness-wise direction by electromagnets.

The resultant elastic anisotropically conductive films will be described specifically. Each of the elastic anisotropically conductive films has dimensions of 6.0 mm in a lateral direction and 1.2 mm in a vertical direction, and she external shape in a plane direction in the elastic anisotropically conductive film has a size capable of being received in each of the openings (dimensions: 6.4 mm×1.6 mm) of the frame plate in the above-described sheet-like probe. In the elastic anisotropically conductive film, 40 conductive parts for connection are arranged at a pitch of 120 μm in a row in a lateral direction.

With respect to each of the conductive parts for connection, its dimensions are 40 μm in the lateral direction and 200 μm in the vertical direction, the thickness is 130 μm, the projected height of the projected part is 15 μm, and the thickness of the insulating part is 100 μm.

Conductive parts for non-connection are arranged between the conductive part for connection located most outside in the lateral direction and the frame plate.

Each of the conductive parts for non-connection has dimensions of 60 μm in the lateral direction, 200 μm in the vertical direction and 130 μm in thickness.

The thickness (thickness of one of the forked portions) of the part to be supported in each of the elastic anisotropically conductive films is 20 μm.

The content of the conductive particles in the conductive parts for connection in each of the elastic anisotropically conductive films was investigated. As a result, the content was about 25% in terms of a volume fraction in all the conductive parts for connection.

A gap h between the level of the front surface of the frame plate in the anisotropically conductive connector and the level of the front surface-side end surface of the conductive part for connection in the elastic anisotropically conductive film is 35 μm, and a ratio h/d of this gap h to a gap d (=15 μm) between the level of the back surface of the frame plate in the above-described sheet-like probe and the level of the electrode surface of the back-surface electrode part is 2.3.

[Production of Circuit Board for Inspection]

Alumina ceramic (coefficient of linear thermal expansion: $4.8 \times 10^{-6}/K$) was used as a base material to produce a circuit board for inspection, in which inspection electrodes were formed in accordance wish a pattern corresponding to the pattern of the electrodes to be inspected in Wafer W1 for test. This circuit board for inspection has dimensions of 30 cm×30 cm as a whole and is rectangular. The inspection electrodes thereof each have dimensions of 60 μm in a lateral direction and 200 μm in a vertical direction. This circuit board for inspection is referred to as "Circuit Board T1 for inspection".

[Test 1]

Wafer W1 for test was arranged on a test table at room temperature (25° C.), a sheet-like probe was arranged on the surface of Wafer W1 for test in alignment in such a manner that the respective front-surface electrode parts thereof are located on the electrodes to be inspected of Wafer W1 for test, and an anisotropically conductive connector was arranged on this sheet-like probe in alignment in such a manner that the respective conductive parts for connection thereof are located on the back-surface electrode parts of the sheet-like probe. Circuit Board T1 for inspection was arranged on this anisotropically conductive connector in alignment in such a manner that the respective inspection electrodes thereof are located on the conductive parts for connection of the anisotropically conductive connector, and Circuit Board T1 for inspection was further pressurized downward under a load of 160 kg (load applied to an electrode structure: about 10 g on the average).

A voltage was successively applied to each of the 15,720 inspection electrodes in Circuit Board T1 for inspection, and an electric resistance between the inspection electrode, to which the voltage had been applied, and another inspection electrode was measured as an electric resistance (hereinafter referred to as "insulation resistance") between the electrode structures in the sheet-like probe to find a proportion (hereinafter referred to as "proportion of insulation failure") of measuring points, at which the insulation resistance was 10 MΩ, or lower, to all measuring points.

When the insulation resistance is 10 MΩ or lower, such an apparatus is difficult to be actually used in electrical inspection of integrated circuits formed on a wafer.

The results are shown in Table 1.

[Test 2]

Wafer W2 for test was arranged on a test table equipped with an electric heater at room temperature (25° C.), a sheet-like probe was arranged on the surface of Wafer W2 for test in alignment in such a manner that the respective front-surface electrode parts thereof are located on the electrodes to be inspected of Wafer W2 for test, and an anisotropically conductive connector was arranged on this sheet-like probe in alignment in such a manner that the respective conductive parts for connection thereof are located on the back-surface electrode parts of the sheet-like probe. Circuit Board T1 for inspection was arranged on this anisotropically conductive connector in alignment in such a manner that the respective inspection electrodes thereof are located on the conductive parts for connection of the anisotropically conductive connector, and Circuit Board T1 for inspection was further pressurized downward under a load of 160 kg (load applied to an electrode structure: about 10 g on the average).

With respect to the 15,720 inspection electrodes in Circuit Board T1 for test, an electric resistance between 2 electrodes electrically connected to each other through the sheet-like probe, the anisotropically conductive connector and Wafer W2 for test was successively measured.

A half value of the electric resistance value measured was recorded as an electric resistance (hereinafter referred to as "conduction resistance") between an inspection electrode of Circuit Board T1 for inspection and an electrode to be inspected of Wafer W2 for test to find, a proportion (hereinafter referred to as "proportion of connection failure") of measuring points, at which the conduction resistance was 1Ω or higher, to all measuring points.

This process is referred to as "Process (1)".

After the pressure against Circuit Board T1 for inspection was then released, the test table was heated to 125° C. and left to stand until the temperature became stable. Thereafter, Circuit Board T1 for inspection was pressurized downward under a load of 160 kg (load applied to an electrode structure 17: about 10 g on the average) to find a proportion, of connection failure in the same manner as in the above-described Process (1).

This process is referred to as "Process (2)".

The pressure against Circuit Board T1 for inspection was then released, and the test table was then cooled to room temperature (25° C.).

This process is referred to as "Process (3)".

The above-described Process (1), Process (2) and Process (3) were regarded as a cycle, and the cycle was continuously repeated 100 times in total. It took about 1.5 hours to complete the cycle.

When the conduction resistance is 1Ω or higher, such an apparatus is difficult to be actually used in electrical inspection of integrated circuits formed on a wafer.

The results are shown in Table 2.

Comparative Example 1

A sheet-like probe, an anisotropically conductive connector and a circuit board for inspection were produced in the same manner as in Example 1 except that a frame plane, each of openings of which had dimensions of 6.4 mm×0.32 mm, was used as the frame plate in the sheet-like probe, and Test 1 and Test 2 were performed. In Comparative Example 1, the external shape (dimensions: 6.0 mm×1.2 mm) in a plane direction in the elastic anisotropically conductive film of the anisotropically conductive connector was unable to be received in each of the openings of the frame plate in the above-described sheet-like probe.

Referential Example 1

A sheet-like probe, an anisotropically conductive connector and a circuit board for inspection were produced in the same manner as in Example 1 except that a frame plate, the thickness of which was 50 μm, was used as the frame plate in the sheet-like probe, and Test 1 and Test 2 were performed. In Referential Example 1, a gap d between the level of the back surface of the frame plate in the sheet-like probe and the level of the electrode surface of the back-surface electrode part is 40 μm, a gap h between the level of the front surface of the frame plate in the anisotropically conductive connector and the level of the front surface-side end surface of the conductive part for connection in the elastic anisotropically conductive film is 35 μm, and a ratio h/d is 0.88.

Referential Example 2

A sheet-like probe, an anisotropically conductive connector and a circuit board for inspection were produced in the same manner as in Example 1 except that a frame plate, the thickness of which was 100 μm, was used as the frame plate in the sheet-like probe, and Test 1 and Test 2 were performed. In Referential Example 2, a gap d between the level of the back surface of the frame plate in the sheet-like probe and the level of the electrode surface of the back-surface electrode part is 90 μm, a gap h between the level of the front surface of the frame plate in the anisotropically conductive connector and the level of the front surface-side end surface of the conductive part for connection in the elastic anisotropically conductive film is 35 μm, and a ratio h/d is 0.4.

The results of the above-described tests are shown in Table 1 and Table 2.

TABLE 1

|  | Proportion of Insulation Failure |
|---|---|
| Example 1 | 0% |
| Comparative Example 1 | 0% |
| Referencial Example 1 | 0% |
| Referencial Example 2 | 0% |

TABLE 2

|  | Number of cycle | Temperature | Example 1 | Comparative Example 1 | Referencial Example 1 | Referencial Example 2 |
|---|---|---|---|---|---|---|
| Proportion | 1 | 25° C. | 0% | 0% | 0% | 30% or more |
| of |  | 125° C. | 0% | 0% | 0% | 30% or more |
| Connection | 10 | 25° C. | 0% | 0% | 0% | not measured |
| Failure |  | 125° C. | 0% | 0% | 0% | not measured |
|  | 50 | 25° C. | 0% | 0% | 1% | not measured |
|  |  | 125° C. | 0% | 1% | 3% | not measured |
|  | 100 | 25° C. | 0% | 1% | 3% | not measured |
|  |  | 125° C. | 0% | 3% | 7% | not measured |

The invention claimed is:

1. A probe member for wafer inspection comprising a sheet-like probe, which includes a frame plate made of a metal, in which a plurality of openings are formed corresponding to electrode regions, in which electrodes to be inspected in all or part of integrated circuits formed on a wafer, which is an object of inspection, and a plurality of contact films arranged on and supported by a front surface of the frame plate so as to close the respective openings, each of the contact films are obtained by arranging, in an insulating film formed of a flexible resin, a plurality of electrode structures each formed by linking a front-surface electrode part exposed to a front surface of the insulating film to a back-surface electrode part exposed to a back surface thereof through a short circuit part extending in a thickness-wise direction of the insulating film in accordance with a pattern corresponding to the electrodes to be inspected, and an anisotropically conductive connector, which is composed of another frame plate, in which a plurality of openings have been formed corresponding to the electrode regions, and a plurality of elastic anisotropically conductive films arranged on and supported by the another frame plate so as to close the respective openings, the anisotropically conductive connector is arranged on a back surface of the sheet-like probe, wherein each of the openings of the frame plate in the sheet-like probe have a size capable of receiving the external shape in a plane direction in the elastic anisotropically conductive film of the anisotropically conductive connector.

2. The probe member for wafer inspection according to claim 1, wherein the elastic anisotropically conductive films each have conductive parts for connection arranged in accordance with a pattern corresponding to the electrodes to be inspected and formed by causing conductive particles exhibiting magnetism to be contained in an elastic polymeric substance, and an insulating part mutually insulating these conductive parts for connection and composed of the elastic polymeric substance.

3. The probe member for wafer inspection according to claim 2, wherein a ratio h/d of a gap h between the level of the front surface of the frame plate in the anisotropically conductive connector and the level of the front surface-side end surface of the conductive part for connection in the elastic anisotropically conductive film to a gap d between the level of the back surface of the frame plate in the sheet-like probe and the level of the electrode surface of the back-surface electrode part is at least 1.2.

4. The probe member for wafer inspection according to claim 1, wherein the thickness of the frame plate in the sheet-like probe is 10 to 200 μm.

5. The probe member for wafer inspection according to claim 1, wherein the frame plate in the sheet-like probe and the frame plate in the anisotropically conductive connector are each formed by a material having a coefficient of linear thermal expansion of at most $3 \times 10^5$/K.

6. A probe card for wafer inspection comprising a circuit board for inspection, on the front surface of which inspection electrodes have been formed in accordance with a pattern corresponding to electrodes to be inspected in all or part of integrated circuits formed on a wafer, which is an object of inspection, and the probe member for wafer inspection according to claim 1, which is arranged on the front surface of the circuit board for inspection.

7. A wafer inspection apparatus for conducting electrical inspection of each of a plurality of integrated circuits formed on a wafer in a state of the wafer, which comprises the probe card for wafer inspection according to claim 6.

* * * * *